(12) United States Patent
Seth et al.

(10) Patent No.: US 9,559,646 B2
(45) Date of Patent: Jan. 31, 2017

(54) APPARATUS AND METHOD FOR DYNAMICALLY BIASED BASEBAND CURRENT AMPLIFIER

(71) Applicant: Samsung Electronics Co., Ltd., Gyeonggi-do (KR)

(72) Inventors: Siddharth Seth, San Jose, CA (US); Sang Won Son, Palo Alto, CA (US); Dae Hyun Kwon, Gyeonggi-do (KR); Sriramkumar Venugopalan, San Jose, CA (US); Thomas Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/819,088

(22) Filed: Aug. 5, 2015

(65) Prior Publication Data
US 2016/0072447 A1    Mar. 10, 2016

Related U.S. Application Data

(60) Provisional application No. 62/048,766, filed on Sep. 10, 2014.

(51) Int. Cl.
| H03F 3/45 | (2006.01) |
|---|---|
| H03F 3/24 | (2006.01) |
| H03F 3/193 | (2006.01) |
| H03F 1/02 | (2006.01) |

(52) U.S. Cl.
CPC ............ *H03F 3/245* (2013.01); *H03F 1/0222* (2013.01); *H03F 3/193* (2013.01); *H03F 3/45183* (2013.01); *H03F 3/45197* (2013.01); H03F 2200/102 (2013.01); H03F 2200/153 (2013.01); H03F 2200/381 (2013.01); H03F 2200/462 (2013.01); H03F 2200/546 (2013.01); *H03F 2200/91* (2013.01); *H03F 2203/30036* (2013.01); *H03F 2203/45112* (2013.01)

(58) Field of Classification Search
CPC ........ H03F 1/0233; H03F 3/193; H03F 3/245; H03F 3/45179; H03F 2200/102; H03F 2200/381; H03F 2200/462; H03F 2203/45151; H03F 1/0222; H03F 3/45183; H03F 2200/546; H03F 2203/45112
USPC ........................................ 330/136, 258, 259
See application file for complete search history.

(56) References Cited

U.S. PATENT DOCUMENTS

| 5,834,951 A | 11/1998 | Klein |
|---|---|---|
| 5,977,829 A | 11/1999 | Wells |
| 6,008,698 A | 12/1999 | Dacus et al. |
| 6,504,432 B1 | 1/2003 | Rokhsaz |

(Continued)

OTHER PUBLICATIONS

Nicola Codega et al., A Current-Mode, Low Out-fo-Band Noise LTE Transmiter With a Class-A/B Power Mixer, IEEE Journal of Solid State Circuits, vol. 49, No. 7, Jul. 2014, pp. 1627-1638.

(Continued)

*Primary Examiner* — Khanh V Nguyen
(74) *Attorney, Agent, or Firm* — The Farrell Law Firm, P.C.

(57) ABSTRACT

A dynamically biased baseband current amplifier is provided. The dynamically biased baseband current amplifier includes an input interface; a controller; a variable resistor network; an amplifier stage; a hybrid differential envelope detector and full-wave rectifier; a transconductor; a first variable transistor; a second variable transistor; a third variable transistor; and a fourth variable transistor.

20 Claims, 13 Drawing Sheets

(56) References Cited

U.S. PATENT DOCUMENTS

| | | |
|---|---|---|
| 6,580,324 B2 * | 6/2003 | Palaskas .............. H03F 3/45659 330/259 |
| 6,831,517 B1 | 12/2004 | Hedberg et al. |
| 6,861,896 B2 | 3/2005 | Tsividis et al. |
| 7,095,256 B1 | 8/2006 | Zhak et al. |
| 7,502,600 B2 | 3/2009 | Kazakevich et al. |
| 7,649,419 B2 | 1/2010 | Hoelzle et al. |
| 8,379,419 B2 | 2/2013 | Yabuzaki et al. |
| 8,416,898 B1 | 4/2013 | Luo et al. |
| 8,587,377 B2 | 11/2013 | Khesbak et al. |
| 8,716,988 B2 | 5/2014 | Yabuzaki et al. |
| 2013/0043953 A1 | 2/2013 | Spiegel |

OTHER PUBLICATIONS

Omid Oliaei et al., A Multiband Multimode Transmitter without Driver Amplifier, ISSCC 2012/Session 9, Wireless Transmitter Techniques, 9.2 2012 IEEE International Solid-State Circuits Conference pp. 164-166.

* cited by examiner

APPARATUS AND METHOD FOR DYNAMICALLY BIASED BASEBAND CURRENT AMPLIFIER

PRIORITY

This application claims priority under 35 U.S.C. §120 to a U.S. Provisional Patent Application filed on Sep. 10, 2014 in the United States Patent and Trademark Office and assigned Ser. No. 62/048,766, the entire contents of which are incorporated herein by reference.

BACKGROUND OF THE DISCLOSURE

Field of the Disclosure

The present disclosure relates generally to a dynamically biased baseband current amplifier, and more particularly, to a dynamically biased baseband current amplifier where a bias current is automatically adjusted based on a signal swing to improve power-efficiency.

Description of the Related Art

Electronic systems used in the fields of wireless communication include $2^{nd}$ Generation (2G), $3^{rd}$ Generation (3G), $4^{th}$ Generation (4G) cellular radio integrated circuits, Wireless Fidelity (WiFi), Bluetooth, Zigbee radio integrated circuits, etc. Such systems include a baseband section that follows a Radio Frequency (RF) down-converter in a receiver or precedes an RF up-converter in a transmitter.

A baseband section consists of two identical paths, one for an in-phase stream (I-stream) and one for a quadrature-phase stream (Q-stream).

Integrated multi-mode multi-band transmitters (TXs) must meet diverse specifications related to output power, spectral regrowth, spurious emissions, out-of-band noise, and gain range, while occupying a small integrated circuit area and maintaining a high power-efficiency. Such transmitters are required to process constant envelope signals in the case of 2G Gaussian Minimum Shift Keying (GMSK), as well as high Peak-to-Average-Power-Ratio (PAPR) signals in the case of 4G Long Term Evolution (LTE), where the use of Orthogonal Frequency Division Multiplexing (OFDM) and complex modulation schemes cause the PAPR to exceed 6 dB.

Within 4G LTE20, the baseband signal can be either wideband, where an 18 MHz channel is fully occupied by 100 Resource Blocks (RBs) of 180 kHz bandwidth (100 RB/Full RB), or narrowband, where all of the signal power is concentrated in a single RB (1RB). When a single or few RBs are transmitted close to a channel edge, the TX non-linearity leads to the generation of third-order and higher-order counter-intermodulation products (e.g., Third-Order Counter-Intermodulation (CIM3), Fifth-Order Counter-Intermodulation (CIM5), etc.) in the adjacent bands, causing the TX to fail spurious emissions specifications.

Different architectures have been proposed to meet these specifications. In a passive-mixer plus Driver Amplifier (DA) based architecture, the DA worsens the CIM terms generated by the passive mixer. CIM3 can be improved by removing the DA by utilizing a current-mode power-mixer. However, such a traditional, power-mixer based TX is biased in Class-A mode (i.e., fixed bias current).

In a fixed-bias system, signal-path circuitry is biased with a fixed current that is sufficiently high to pass a peak signal swing with good linearity. As the PAPR rises, peak signal swings occur less frequently, and a fixed bias current system unnecessarily wastes power by always being ready to process a peak signal swing that does not always occur.

In addition, Envelope-Tracking (ET) is a technique that is used to adaptively bias RF Power Amplifiers (PA)/Drive Amplifiers (DA). ET PAs require a fast and highly-linear supply modulator to generate a power-supply voltage that tracks an envelope of an RF signal. The delays of the phase and envelope paths must be matched well to maintain a low Error Vector Magnitude (EVM) and high linearity, requiring additional circuitry. Envelope-tracking can be implemented by changing a bias current of a DA. In this case, the bias current is derived from the RF envelope by squaring the RF signal. Also, the envelope tracking method is a single-ended technique where the linearity of the envelope generating and supply modulation circuit directly affects the linearity performance of the power amplifier/drive amplifier.

ET methods are applied to RF circuitry that processes an I-Q combined and upconverted RF signal, which has a slowly-varying envelope. In addition, in an IQ upconverter, the individual I and Q baseband signal streams have more instantaneous signal swing variation than the RF envelope. Effectively, each I and Q stream has a larger PAPR as compared to the RF envelope. For example, while an RF envelope of a 2G GMSK signal is constant, the underlying I and Q streams have a PAPR of 3 dB.

In the related art, a rectification circuit and an envelope detection circuit are two separate circuits having two different circuit designs, where one circuit performs rectification while the other circuit performs envelope detection. The related art does not disclose one circuit that can perform both rectification and envelope detection. In addition, rectification circuits and envelope detection circuits receive a single-ended input and provide a single-ended output voltage.

SUMMARY OF THE INVENTION

The present disclosure has been made to address the above-mentioned problems and disadvantages, and to provide at least the advantages described below.

Accordingly, an aspect of the present disclosure is to provide a dynamically biased baseband current amplifier that is power-efficient.

Another aspect of the present disclosure is to provide a dynamically biased baseband current amplifier with either a voltage input interface or a current input interface.

Another aspect of the present disclosure is to provide a dynamically biased baseband current amplifier using a hybrid differential envelope detector and full-wave rectifier to generate a dynamic current based on a differential voltage swing, where the dynamic current is used to bias the baseband current amplifier.

Another aspect of the present disclosure is to provide a dynamically biased baseband current amplifier, where an input signal and noise are filtered.

Another aspect of the present disclosure is to provide a dynamically biased baseband current amplifier, where filters, current, transistor sizes, and capacitor sizes are each digitally programmable.

BRIEF DESCRIPTION OF THE DRAWINGS

The above and other aspects, features, and advantages of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
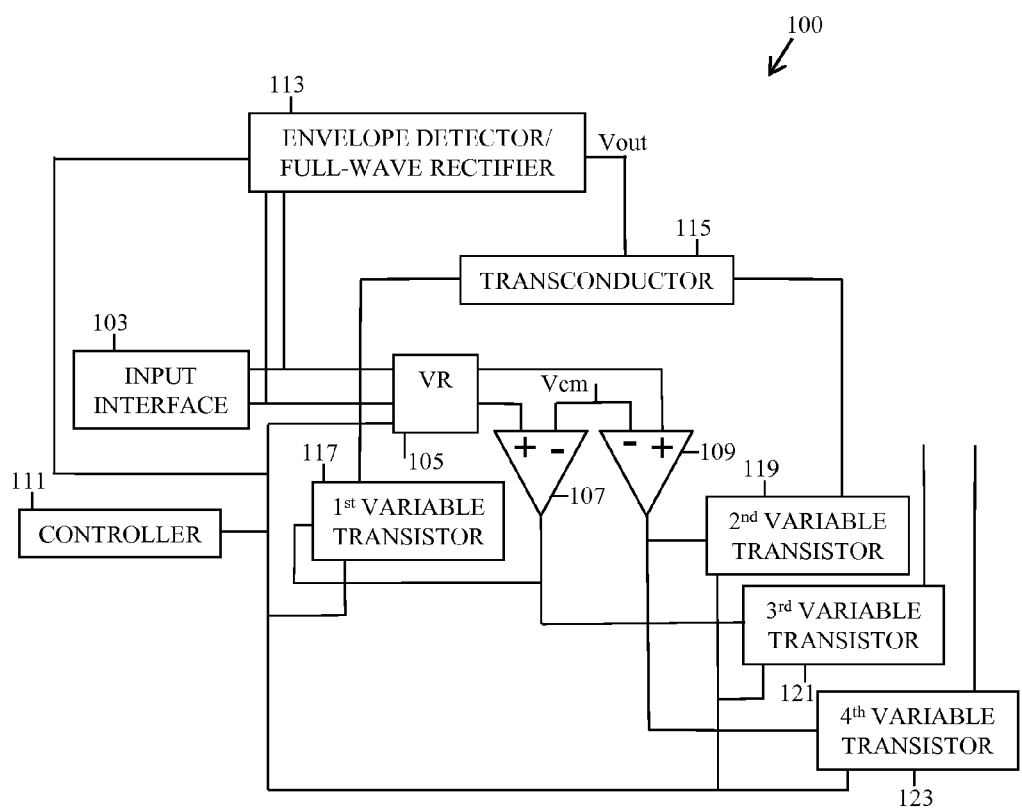
FIG. 1 is a schematic diagram of a dynamically biased baseband current amplifier according to an embodiment of the present disclosure.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments will now be described in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have meanings equal to the contextual meanings in the relevant field of art, and are not to be interpreted to have ideal or excessively formal meanings unless clearly defined in the present disclosure.

Although the following description of the embodiments of the present disclosure uses terms and names defined for Complementary Metal Oxide Semiconductor (CMOS) Field Effect Transistors (FETs) (i.e., N-channel MOSFETs (NMOS), or NFETs, and P-channel MOSFETs (PMOS), or PFETs), the present disclosure is not limited by these terms and names, and is identically applicable to other similar technologies (e.g., NMOS, PMOS, Fin-shaped FET (Fin-FET), Bipolar, Gallium Arsenide (GaAs), Indium GaAs (InGaAs), etc.).

The present disclosure describes a dynamically biased baseband current amplifier. By dynamically biasing the baseband current amplifier, the present disclosure consumes less power by not always biasing the current amplifier to process a peak swing signal. In addition, the circuitry of the present disclosure occupies a smaller area of an integrated circuit than equivalent functions implemented as two separate circuits.

In a power-mixer architecture, an amplified and filtered baseband I and Q currents at an output of a Voltage-to-Current (V2I) are provided to an active double-balanced mixer. In such an architecture, if the individual I and Q baseband blocks of the V2I converter are dynamically biased, the total Direct Current (DC) power consumption from the power supply (e.g., $V_{DD}$) node connected to a center-tap of a balun will be reduced. With a dynamically-adjusted bias current, the average output DC current is lower, leading to better power efficiency.

FIG. 1 is a schematic diagram of a dynamically biased baseband current amplifier 100 according to an embodiment of the present disclosure.

Referring to FIG. 1, the dynamically biased baseband current amplifier 100 includes an input interface 103, a variable resistor network 105, a first differential amplifier 107, a second differential amplifier 109, a controller 111, a hybrid differential envelope detector and full-wave rectifier 113, a transconductor 115, a first variable transistor 117, a second variable transistor 119, a third variable transistor 121, and a fourth variable transistor 123.

Figure 2:
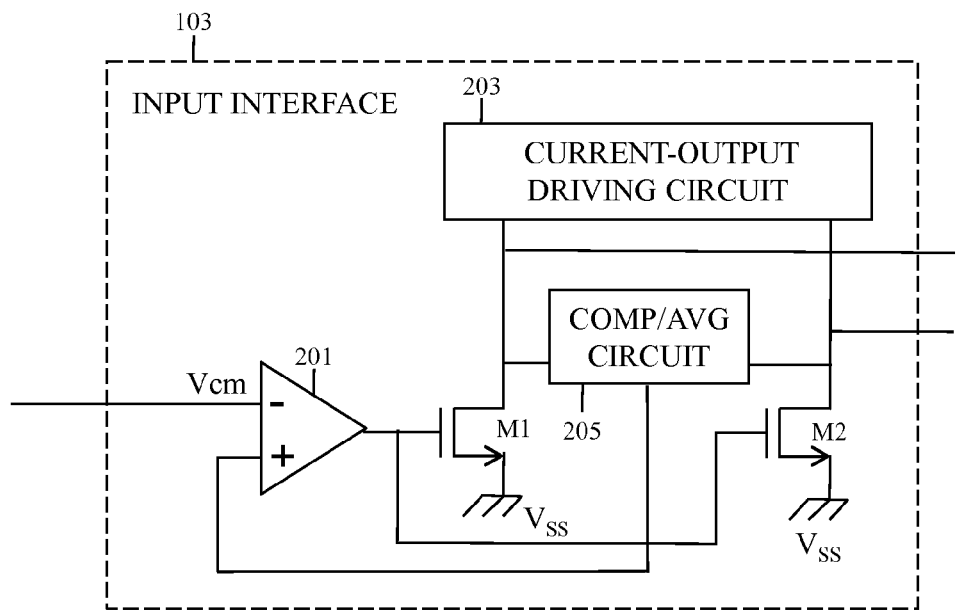
FIG. 2 is a schematic diagram of a input interface of FIG. 1 according to an embodiment of the present disclosure.

The input interface 103 is selected from either a voltage type that provides a differential input voltage or a current that provides a differential input current. The voltage type input interface 103 may include a baseband amplifier, a filter, a Digital-to-Analog Converter (DAC), a mixer down-converter, etc. that produces a differential output voltage. A current type input interface 103 may include a baseband amplifier, a filter, a Digital-to-Analog Converter (DAC), a mixer down-converter, and so on that produces a differential output current. A current type input interface 103 is illustrated in FIG. 2 and described below in more detail.

Figure 4:
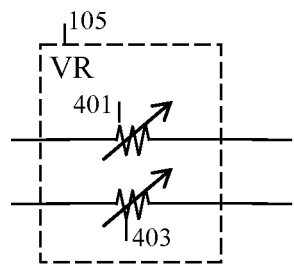
FIG. 4 is a schematic diagram of a variable resistor network of FIG. 1 according to an embodiment of the present disclosure.
Figure 5:
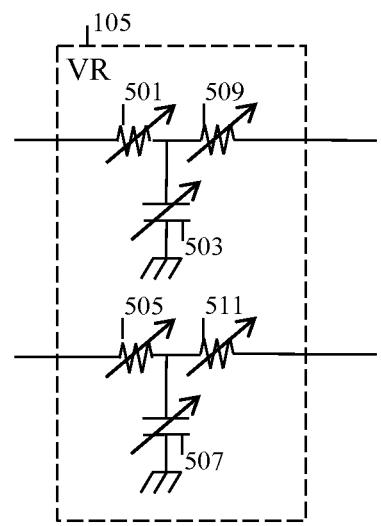
FIG. 5 is a schematic diagram of a variable resistor network of FIG. 1 that includes a filter according to an embodiment of the present disclosure.
Figure 6:
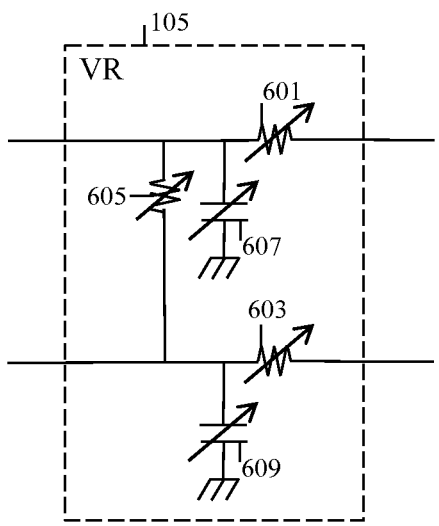
FIG. 6 is a schematic diagram of a variable resistor network of FIG. 1 that includes a filter for a current input interface according to an embodiment of the present disclosure.

In FIG. 1, the variable resistor network 105 has a positive input connected to the positive differential output of the input interface 103, a negative input connected to the negative differential output of the input interface 103, a positive output, and a negative output. The variable resistor network 105 may be a voltage input type and a current input type. Two voltage input type variable resistor networks 105 are illustrated in FIGS. 4 and 5 and described below in more detail. A current input type variable resistor network 105 is illustrated in FIG. 6 and described below in more detail.

In FIG. 1, the first differential amplifier 107 has a positive input connected to the negative output of the variable resistor network 105, a negative input for receiving a common mode voltage ($V_{cm}$), and an output.

The second differential amplifier 109, has a positive input connected to the positive output of the variable resistor network 105, a negative input for receiving the common mode voltage ($V_{cm}$), and an output.

The controller 111 is connected to the variable resistor network 105, the hybrid differential envelope detector and full-wave rectifier 113, the first variable transistor 117, the second variable transistor 119, the third variable transistor 121, and the fourth variable transistor 123. The controller 111 controls the values of the components in the variable resistor network 105, controls whether the hybrid differential envelope detector and full-wave rectifier 113 is in envelope detection mode or full-wave rectification mode, controls the first variable transistor 117 and the second variable transistor 119 to establish an output current, and controls the third variable transistor 121 and the fourth variable transistor 123 to mirror the output current.

The hybrid differential envelope detector and full-wave rectifier 113 has a first input for receiving a control input from the controller 111, a second input connected to the positive output of the input interface 103, a third input connected to the negative output of the input interface 103, and an output connected to an input of the transconductor 115. The hybrid differential envelope detector and full-wave rectifier 113 produces a voltage $V_{out}$ at its output.

The transconductor 115 has an input connected to the output of the hybrid differential envelope detector and full-wave rectifier 113, a first output, and a second output. The transconductor 115 converts the output voltage of the hybrid differential envelope detector and full-wave rectifier 113 into a current (e.g. a dynamic biasing current $I_{dynamic}$). $I_{dynamic}$ consists of two parts, a fixed offset current that is set by the value of a voltage $V_{base}$, which can be set by a user, and an amplitude of the dynamic portion of $I_{dynamic}$ that is set by the size (i.e., the mirror ratio) of the PFET transistors M97 and M98 as compared to PFET transistor M92, which can be set by the user, as described below with respect to FIG. 9A.

To save more power the fixed offset current is reduced and the amplitude of the dynamic portion of $I_{dynamic}$ is increased. In contrast, to provide greater linearity the fixed offset current is increased and the amplitude of the dynamic portion of $I_{dynamic}$ is reduced, which increases power consumption. Reducing $V_{base}$ increases the fixed offset current, and vice versa. The amplitude of the dynamic portion of is increased by increasing the mirror ratio of the PFET transistors M97 and M98 as compared to PFET transistor M92 and vice versa.

Figure 3:
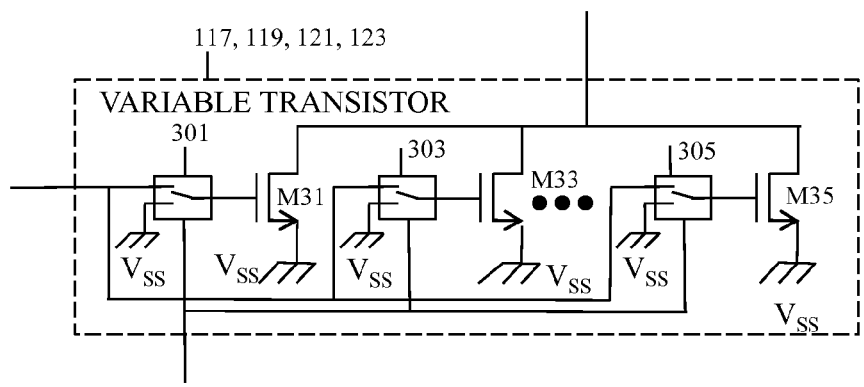
FIG. 3 is a schematic diagram of a variable transistor of FIG. 1 according to an embodiment of the present disclosure.

The first variable transistor 117 has a control input for receiving a control signal from the controller 111, an input connected to the output of the first differential amplifier 107, and an input connected to the first output of the transconductor 115. The details of the first variable transistor 117, the second variable transistor 119, the third variable transistor 121, and the fourth variable transistor 123 are illustrated in FIG. 3 and described below.

In FIG. 1, the second variable transistor 119 has a control input for receiving a control signal from the controller 111, an input connected to the output of the second differential amplifier 109, and an input connected to the second output of the transconductor 115.

The third variable transistor 121 has a control input for receiving a control signal from the controller 111, an input connected to the output of the first differential amplifier 107, and an output.

The fourth variable transistor 123 has a control input for receiving a control signal from the controller 111, an input connected to the output of the second differential amplifier 109, and an output.

The third variable transistor 121 and the fourth variable transistor 123 amplify $I_{dynamic}$ so that the average DC current is smaller than when amplifying a current that is not dynamic (i.e., a fixed bias current).

FIG. 2 is a schematic diagram of the input interface 103 of FIG. 1 according to an embodiment of the present disclosure, which includes a common mode feedback circuit to ensure that the input common mode voltage is $V_{cm}$.

Referring to FIG. 2, the input interface 103 is a current type input interface. The input interface 103 includes a differential amplifier 201, a first NFET transistor M1, a second NFET transistor M2, a current-output driving circuit 203, and a compensation/averaging circuit 205.

The differential amplifier 201 has a negative input for receiving $V_{cm}$, a positive input connected to the output of the compensation/averaging circuit 205, and an output connected to the gate of the first NFET transistor M1.

The first NFET transistor M1 has a source connected to a ground potential (e.g. $V_{SS}$), a gate connected to the output of the differential amplifier 201, and a drain connected to a first output of the current-output driving circuit 203 and a first input of the compensation/averaging circuit 205. The drain of the first NFET M1 is the positive output of the input interface 103.

The second NFET transistor M2 has a source connected to the ground potential (e.g. $V_{SS}$), a gate connected to the output of the differential amplifier 201, and a drain connected to a second output of the current-output driving circuit 203 and a second input of the compensation/averaging circuit 205. The drain of the second NFET M2 is the negative output of the input interface 103.

FIG. 3 is a schematic diagram of a variable transistor (e.g., the first, second, third, and fourth variable transistors 117, 119, 121, and 123 of FIG. 1 and the variable transistor 703 of FIG. 7 described below) according to an embodiment of the present disclosure.

Referring to FIG. 3, each of the variable transistors 117, 119, 121, and 123 includes n NFETs M31, M33, . . . , M35 and n switches 301, 303, . . . , 305. However, the present disclosure is not limited to variable transistors 117, 119, 121, and 123 that use NFETs or is configured as illustrated in FIG. 3. Other types of transistors and arrangements are possible, as illustrated, for example, in FIG. 15 and described below.

An input is received and connected to a first input terminal of each of the n switches 301, 303, . . . , 305. A second input terminal of each of the n switches 301, 303, . . . , 305 is connected to a ground potential (e.g., $V_{SS}$). A gate of each of the n NFETs M31, M33, . . . , M35 is connected to an output terminal of one of the n switches 301, 303, . . . , 305. A source of each of the n NFETs M31, M33, . . . , M35 is connected to the ground potential (e.g. Vss). A drain of each of the n NFETs M31, M33, . . . , M35 is connected together to form the drain input of the variable transistors 117, 119, 121, and 123.

A control input bus, having n inputs for receiving n control bits from the controller 111, is connected to the n switches 301, 303, . . . , 305, so that each control input of each of the n switches 301, 303, . . . , 305 receives one of the n control bits from the controller 111, which causes either the input or the ground potential (e.g. $V_{SS}$) to be applied to one of the gates of n NFETs M31, M33, . . . , M35. Applying the input to a gate of one of the n NFETs M31, M33, . . . , M35 turns on the corresponding NFET, and applying a ground potential (e.g. $V_{SS}$) to a gate of one of the n NFETs M31, M33, . . . , M35 turns off the corresponding NFET.

The control bits received from the controller 111 determine which of the n NFETs M31, M33, . . . , M35 is turned on or turned off. The number of NFETs that are turned on and the sizes of the NFETS that are turned on determine a current that the variable transistor 117, 119, 121, and 123 can sink. The sizes of the n NFETs M31, M33, . . . , M35 may be the same or they may be different from each other. If the sizes are different, the difference may be in a predetermined pattern (e.g., a ladder pattern for greater accuracy).

FIG. 4 is a schematic diagram of a variable resistor network 105 of FIG. 1 according to an embodiment of the present disclosure.

Referring to FIG. 4, the variable resistor network 105 is for connecting to a voltage type input interface 103 and includes a first variable resistor 401 and a second variable resistor 403. The first variable resistor 401 is connected between the positive input and the positive output of the variable resistor network 105. The second variable resistor 403 is connected between the negative input and the negative output of the variable resistor network 105. The first variable resistor 401 and the second variable resistor 403 convert an input voltage to an input current.

FIG. 5 is a schematic diagram of a variable resistor network 105 that includes a filter of FIG. 1 according to an embodiment of the present disclosure.

Referring to FIG. 5, the variable resistor network 105 is for connecting to a voltage type input interface 103 and includes a first variable resistor 501, a first variable capacitor 503, a second variable resistor 505, a second variable capacitor 507, a third variable resistor 509, and a fourth variable resistor 511. The first end of the first variable resistor 501 is connected to the positive input of the variable resistor network 105. The second end of the first variable resistor 501 is connected to the first end of the first variable capacitor 503 and the first end of the third variable resistor 509. The second end of the first variable capacitor 503 is connected to the ground potential (e.g. $V_{SS}$), and the second end of the third variable resistor 509 is connected to the positive output of the variable resistor network 105. The first end of the second variable resistor 505 is connected to the negative input of the variable resistor network 105. The second end of the second variable resistor 505 is connected to the first end of the second variable capacitor 507 and the first end of the fourth variable resistor 511. The second end of the second variable capacitor 507 is connected to the ground potential (e.g. $V_{SS}$), and the second end of the fourth variable resistor 511 is connected to the negative output of the variable resistor network 105.

The first variable resistor 501 and the first variable capacitor 503 form an RC filter. The second variable resistor 505 and the second variable capacitor 507 also form an RC filter. When processing lower bandwidth signals (e.g. 2G, where the baseband bandwidth is 100 kHz) the pole of the RC filter is moved in to reduce the filter bandwidth by increasing the resistor and capacitor values. When processing higher bandwidth signals (e.g. 3G, where the baseband bandwidth is 1.92 MHz, or 4G LTE20, where the baseband bandwidth is 9 MHz) the pole of the RC filter is moved out to increase the filter bandwidth to pass a larger bandwidth signal, by reducing the capacitor value. The present disclosure is not limited to using RC filters. Any other suitable filter may be used.

FIG. 6 is a schematic diagram of a variable resistor network 105 that includes a filter for a current input interface of FIG. 1 according to an embodiment of the present disclosure.

Referring to FIG. 6, the variable resistor network 105 is for connecting to a current type input interface 103 and includes a first variable resistor 601, a second variable resistor 603, a third variable resistor 605, a first variable capacitor 607, and a second variable capacitor 609. The first variable resistor 601 is connected between the positive input and the positive output of the variable resistor network 105. The second variable resistor 603 is connected between the negative input and the negative output of the variable resistor network 105. The third variable resistor 605 is connected between the positive input and the negative input of the variable resistor network 105. The first end of the first variable capacitor 607 is connected to the positive input of the variable resistor network 105. The second end of the first variable capacitor 607 is connected to the ground potential (e.g. $V_{SS}$). The first end of the second variable capacitor 609 is connected to the negative input of the variable resistor network 105. The second end of the second variable capacitor 609 is connected to the ground potential (e.g. $V_{SS}$).

The third variable resistor 605, the first variable capacitor 607, and the second variable capacitor 609 form a filter network. The present disclosure is not limited to the filter network illustrated in FIG. 6. Any other suitable filter network may be used.

Figure 7:
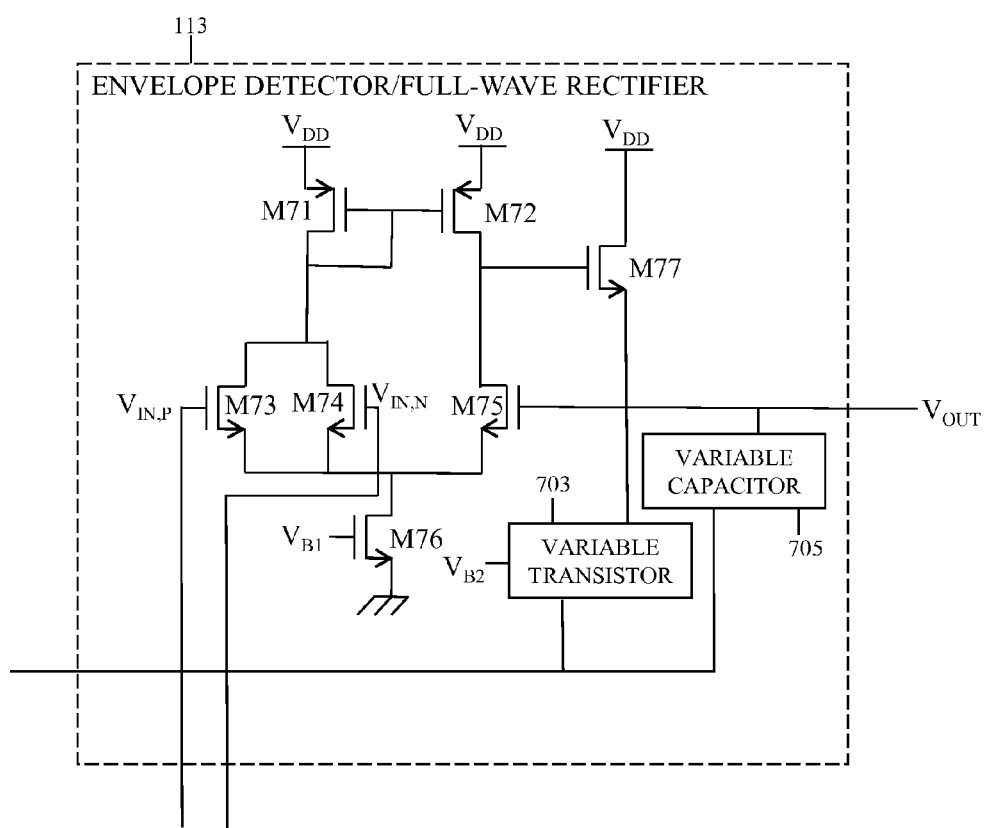
FIG. 7 is a schematic diagram of a hybrid differential envelope detector and full-wave rectifier of FIG. 1 according to an embodiment of the present disclosure.

FIG. 7 is a schematic diagram of the hybrid differential envelope detector and full-wave rectifier 113 of FIG. 1 according to an embodiment of the present disclosure. A voltage generated at the input of the dynamically biased baseband current amplifier 100 is sensed by the envelope detector and full-wave rectifier 113, which generates a dynamic current that is based on a differential input voltage swing. The dynamic current may be combined with a fixed offset current to bias an input of a voltage to current converter as illustrated in FIG. 9B and described below.

Referring to FIG. 7, the hybrid differential envelope detector and full-wave rectifier 113 includes a first PFET M71, a second PFET M72, a first NFET M73, a second NFET M74, a third NFET M75, a fourth NFET M76, a fifth NFET M77, a variable transistor 703, and a variable capacitor 705. However, the present disclosure is not limited to a hybrid envelope detector and full-wave rectifier 113 that uses NFETs and PFETs or is configured as illustrated in FIG. 7. Other types of transistors and arrangements are possible, as illustrated, for example, in FIG. 14 and described below. The hybrid differential envelope detector and full-wave rectifier 113 of the present disclosure may be implemented with just PFETs, just NFETs, or using any other suitable transistor type (e.g. CMOS, NMOS, PMOS, Bipolar, Fin-FET, GaAs, InGaAs, etc.).

The first PFET M71 has its source connected to a power supply voltage (e.g. $V_{DD}$), and its gate connected to its drain, the gate of the second PFET M72, the drain of the first NFET M73, and the drain of the second NFET M74.

The second PFET M72 has its source connected to the power supply voltage (e.g. $V_{DD}$), its gate connected to the gate of the first PFET M71, and its drain connected to the drain of the third NFET M75 and the gate of the fifth NFET M77.

The first NFET M73 has its drain connected to the drain of the first PFET M71, the drain of the second NFET M74, the drain and the gate of the first PFET M71, and the gate of the second PFET M72. The source of the first NFET M73 is connected to the source of the second NFET M74, the source of the third NFET M75, and the drain of the fourth NFET M76. The gate of the first NFET M73 is the positive terminal of the hybrid differential envelope detector and full-wave rectifier 113 and receives a positive differential input voltage (e.g., $V_{in,p}$).

The second NFET M74 has its drain connected to the drain and the gate of the first PFET M71, the gate of the second PFET M72, and the drain of the first NFET M73. The source of the second NFET M74 is connected to the source of the first NFET M73, the source of the third NFET M75, and the drain of the fourth NFET M76. The gate of the second NFET M74 is the negative terminal of the hybrid differential envelope detector and full-wave rectifier 113 and receives a negative differential input voltage (e.g., $V_{in,n}$).

The third NFET M75 has its source connected to the source of the first NFET M73, the source of the second NFET M74, and the drain of the fourth NFET M76. The drain of the third NFET M75 is connected to the drain of the second PFET M72 and the gate of the fifth NFET M77. The gate of the third NFET M75 is connected to the source of the fifth NFET M77, a drain input of the variable transistor 703, and a first terminal input of the variable capacitor 705. The output voltage (e.g. $V_{out}$) of the hybrid differential envelope detector and full-wave rectifier 113 appears at the gate of the third NFET M75.

The fourth NFET M76 has its source connected to a ground potential (e.g. $V_{SS}$) and its drain is connected to the source of the first NFET M73, the source of the second NFET M74, and the source of the third NFET M75. The gate of the fourth NFET M76 receives a first bias voltage (e.g., $V_{B1}$), which, in conjunction with the size of the fourth NFET M76, establishes a bias current $I_{bias}$ for the input stage of the hybrid differential envelope detector and full-wave rectifier 113.

The fifth NFET M77 has its drain connected to the power supply voltage (e.g. $V_{DD}$). The gate of the fifth NFET M77 is connected to the drain of the second PFET M72 and the drain of the third NFET M75. The source of the fifth NFET M77 is connected to the gate of the third NFET M75, the drain input of the variable transistor 703 and the first terminal input of the variable capacitor 705. The output voltage (e.g. $V_{out}$) of the hybrid differential envelope detector and full-wave rectifier 113 appears at the source of the fifth NFET M77.

A output of the controller 111 is connected to a control input bus of the variable transistor 703 and a control input bus of the variable capacitor 705. The controller 111 controls the effective size (e.g. width) of the variable transistor 703 and the effective capacitance of the variable capacitor 705.

The variable transistor 703 has a gate input for receiving a second bias voltage (e.g. $V_{B2}$), a control input bus connected to the controller 111, and a drain input connected to the gate of the third NFET M75, the source of the fifth NFET M77, and the first terminal of the variable capacitor 705. The output voltage (e.g. $V_{out}$) of the hybrid differential envelope detector and full-wave rectifier 113 appears at the drain input of the variable transistor 703.

The variable capacitor 705 has a control input bus connected to the controller 111 and a terminal connected to the gate of the third NFET M75, the source of the fifth NFET M77, and the drain input of the variable transistor 703. The output voltage (e.g. $V_{out}$) of the hybrid differential envelope detector and full-wave rectifier 113 appears at the first terminal of the variable capacitor 705. Alternatively, the second terminal of the variable capacitor 705 may be connected to a predetermined Direct Current (DC) voltage other than the ground potential.

In an embodiment of the present disclosure, the first NFET M73, the second NFET M74, and the third NFET M75 have the same size (e.g. width). Thus, if either $V_{in,p}$ or $V_{in,n}$ is greater than $V_{out}$, then the third NFET M75 turns off and the voltage on the gate of the fifth NFET M77 rises, turning on the fifth NFET M77. Then, a charging current $I_{charge}$ flows from the source of the fifth NFET M77 to charge the effective capacitance C of the variable capacitor 705.

If either $V_{in,p}$ or $V_{in,n}$ is less than $V_{out}$, then the third NFET M75 turns on, which turns off the fifth NFET M77, and causes the voltage $V_{out}$ of the effective capacitance of the variable capacitor 705 to be discharged through the variable transistor 703 via a discharge current $I_{discharge}$.

The rate at which $V_{out}$ is discharged when the fifth NFET M77 is turned off is given by Equation (1) as follows:

$$\frac{dV_{out}}{dt} = \frac{I_{discharge}}{C} \quad (1)$$

The rate at which the voltage $V_{out}$ rises when the fifth NFET M77 is turned on is given by Equation (2) as follows:

$$\frac{dV_{out}}{dt} = \frac{I_{charge} - I_{discharge}}{C} \quad (2)$$

Note that the value of $I_{discharge}$ is controlled only by the effective size of the variable transistor 703, which can be changed to change the value of $I_{discharge}$. In addition, the value of $I_{charge}$ depends on the relative difference between the voltage $V_{out}$ and the maximum of the voltages $V_{in,p}$ and $V_{in,n}$.

A high loop gain in the hybrid differential envelope detector and full-wave rectifier 113 ensures that the static difference between $V_{out}$ and the peak voltage of $V_{in,p}$ or $V_{in,n}$ remains small. Thus, if the DC voltage on $V_{in,p}$ and is $V_{in,DC}$ volts and $V_{in,p}$ and $V_{in,n}$ swing+/−$V_{in,ac}$ volts, then the maximum voltage swing on $V_{out}$ is $V_{in,DC}+V_{in,ac}$ volts. When both $V_{in,p}$ and $V_{in,n}$ are close to their "zero-crossing" value of $V_{in,DC}$ volts, then the first NFET M73, the second NFET M74, and the third NFET M75 each supply $I_{bias}/4$, $I_{bias}/4$, and $I_{bias}/2$, respectively. Because the first NFET M73, the second NFET M74, and the third NFET M75 are the same size and have the same source voltage, the generated gate-to-source voltage on the third NFET M75 is greater than $V_{in,DC}$. Consequently, the generated Vout is slightly greater than $V_{in,DC}$ (e.g. by around 50 mV to 100 mV).

The effective value of the capacitance C and the discharge current $I_{discharge}$ determine how closely the voltage $V_{out}$ tracks the greater of the voltages $V_{in,p}$ and $V_{in,n}$. By switching the effective capacitance value of C between a low value (e.g. 0.1 pF) and a high value (e.g. 10 pF) the mode of the hybrid differential envelope detector and full-wave rectifier 113 is switched from that of a full-wave rectifier to that of a differential envelop detector.

When the capacitance C is 0.1 pF, $V_{out}$ exactly tracks the larger of the two voltages $V_{in,p}$ and $V_{in,n}$ and the hybrid differential envelop detector and full-wave rectifier 113 functions as a full-wave rectifier (i.e., $V_{out}$ is a full-wave rectified version of the greater of $V_{in,p}$ and $V_{in,n}$). When the capacitance value C is small, the $V_{out}$ node can be charged and discharged quickly.

When the capacitance C is 10 pF, $V_{out}$ slowly tracks the peaks of the two voltages $V_{in,p}$ and $V_{in,n}$ and the hybrid differential envelop detector and full-wave rectifier 113 functions as a differential envelope detector (i.e., $V_{out}$ is a peak detection version of the greater of $V_{in,p}$ and $V_{in,n}$). When the capacitance value C is large, the $V_{out}$ node is charged and discharged slowly (effectively reducing the bandwidth of the envelope detector), which switches the mode of the hybrid differential envelope detector and full-wave rectifier 113 to a differential envelope detector (e.g. a peak detector).

In an embodiment of the present disclosure, the hybrid differential envelope detector and full-wave rectifier 113 is switched to envelope detection mode for narrowband input signals such as a single tone (e.g., a 180 KHz wide signal centered around 9 MHz), a combination of two or more tones, a signal in the $4^{th}$ Generation (4G) Long Term Evolution (LTE) system that is one resource block wide, etc., where the variable transistor 703 is controlled by the controller 111 to establish an $I_{discharge}$ current of 16 uA.

In an embodiment of the present disclosure, the hybrid differential envelope detector and full-wave rectifier 113 is switched to full-wave rectifier mode for wideband input signals (e.g., a 18 MHz wide signal centered around 0 MHz) such as a $2^{nd}$ Generation (2G) Gaussian Minimum Shift Keying (GMSK) input signal, a 2G Enhanced Data rates for Global system for mobile communications Evolution (EDGE) input signal, a $3^{rd}$ Generation (3G) Wideband Code Division Multiple Access (WCDMA), a 4G LTE input signal that is a full resource block wide, etc., where the variable transistor 703 is controlled by the controller 111 to establish an $I_{discharge}$ current of 20 uA.

Figure 8:
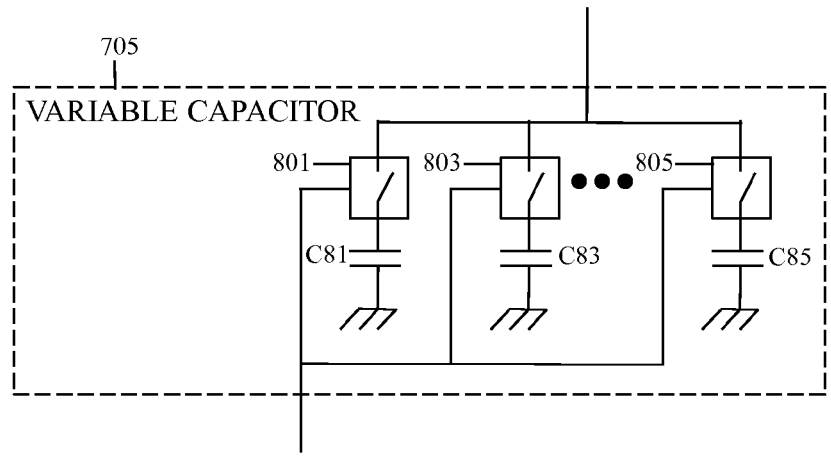
FIG. 8 is a schematic diagram of a variable capacitor of FIG. 7 according to an embodiment of the present disclosure.

FIG. 8 is a schematic diagram of the variable capacitor 705 of FIG. 7 according to an embodiment of the present disclosure.

Referring to FIG. 8, the variable capacitor 705 includes n capacitors C81, C83, . . . , C85 and n switches 801, 803, . . . , 805. However, the present disclosure is not limited to a variable capacitor 705 that is configured as illustrated in FIG. 8. Other types of arrangements are possible (e.g., series, series and parallel, etc.).

A first terminal of each of the n capacitors C81, C83, . . . , C85 is connected to a first input terminal of each of the n switches 801, 803, . . . , 805, respectively. A second input terminal of each of the n capacitors C81, C83, . . . , C85 is connected to a ground potential (e.g., $V_{SS}$). A second input terminal of each of the n switches 801, 803, . . . , 805 is connected together to form the terminal of the variable capacitor 705. Alternatively, the second terminal of each of the n capacitors C81, C83, . . . , C85 may be connected to a DC voltage other than the ground potential (e.g., $V_{SS}$).

A control input bus, having n inputs for receiving n control bits from the controller 111, is connected to the n switches 801, 803, . . . , 805, so that each control input of each of the n switches 801, 803, . . . , 805 receives one of the n control bits from the controller 111, which causes one of the n capacitors C81, C83, . . . , C85 to be connected to, or disconnected from, the terminal of the variable capacitor 705.

The control bits received from the controller 111 determine which of the n capacitors C81, C83, . . . , C85 is connected to the terminal of the variable capacitor 705. The number of capacitors that are connected to the terminal of the variable capacitor 705, the sizes of the capacitors, and $I_{discharge}$ determine how closely $V_{out}$ tracks the greater of $V_{in,p}$ and $V_{in,n}$. The sizes of the n capacitors C81, C83, . . . , C85 may be the same or they may be different from each other. If the sizes are different, the difference may be in a predetermined pattern (e.g., a ladder pattern for greater accuracy).

Figure 9A:
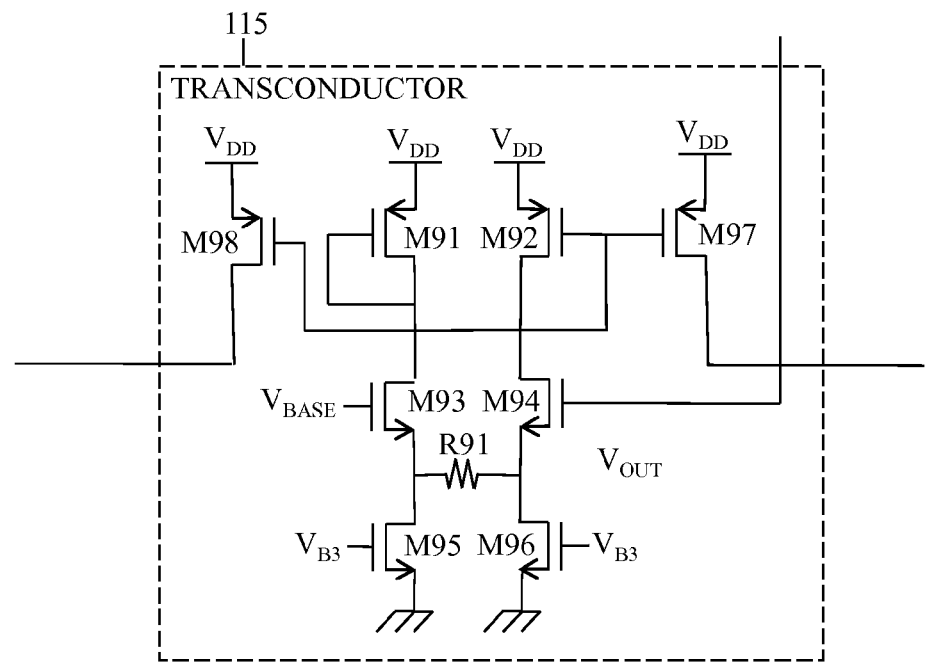
FIG. 9A is a schematic diagram of a transconductor of FIG. 1 according to an embodiment of the present disclosure.
Figure 9B:
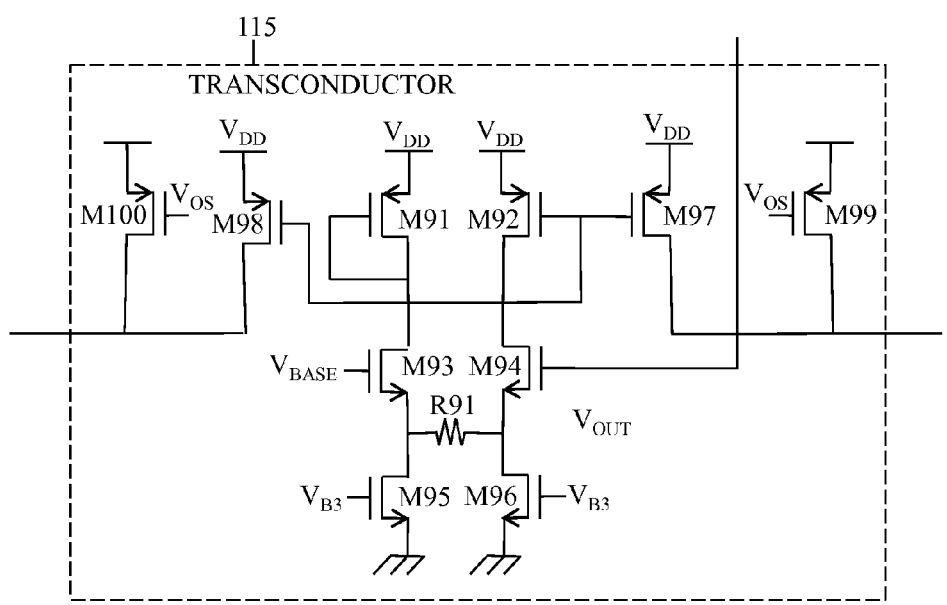
FIG. 9B is a schematic diagram of a transconductor of FIG. 1 with a fixed offset current according to an embodiment of the present disclosure.

FIG. 9A is a schematic diagram of a transconductor 115 of FIG. 1 according to an embodiment of the present disclosure for converting the voltage $V_{out}$ to a current $I_{out}$ that is proportional to $V_{out}$.

Referring to FIG. 9A, the transconductor 115 (e.g. a source-degenerated differential amplifier with diode-connected loads) includes a first PFET M91, a second PFET M92, a third PFET M97, a fourth PFET M98, a first NFET M93, a second NFET M94, a resistor R91, a third NFET M95, and a fourth NFET M96. Other types of transistors and arrangements are possible, as illustrated, for example, in FIG. 17 described below.

The first PFET M91 has a source connected to a power supply voltage (e.g. $V_{DD}$) and a gate connected to its drain and the drain of the first NFET M93, wherein the first PFET M91 is connected as a diode. The second PFET M92 has a source connected to a power supply voltage (e.g. $V_{DD}$) and a gate connected to its drain, the drain of the second NFET M94, the gate of the third PFET M97, and the gate of the fourth PFET M98, wherein the second PFET M92 is connected as a diode. The first NFET M93 has a drain connected to the drain and gate of the first PFET M91, a gate for receiving a reference voltage (e.g. $V_{BASE}$), and a source connected to a first end of a resistor R91 and the drain of the third NFET M95. The second NFET M94 has a drain connected to the gate of the third PFET M97, the gate of the fourth PFET M98, and the drain and gate of the second PFET M92. The second NFET M94 also has a gate for receiving $V_{out}$, and a source connected to a second end of the resistor R91 and the drain of the fourth NFET M96. The third NFET M95 has a drain connected to the source of the first NFET M93 and the first end of the resistor R91. The third NFET M95 also has a gate for receiving a bias voltage (e.g. $V_{B3}$) and a source connected to a ground potential (e.g. $V_{SS}$). The fourth NFET M96 has a drain connected to the source of the second NFET M94 and the second end of the resistor R91. The fourth NFET M96 also has a gate for receiving the bias voltage (e.g. $V_{B3}$) and a source connected to the ground potential (e.g. $V_{SS}$). The third PFET M97 has a source connected to the power supply voltage (e.g. $V_{DD}$) and a gate connected to the gate and drain of the second PFET M92, the gate of the fourth PFET M98, and the drain of the second NFET M94. $I_{out}$ appears at the drain of the second PFET M92 and is proportional to $V_{out}$. $I_{dynamic}$ appears at the drain of the third PFET M97 and the drain of the fourth PFET M98. $I_{dynamic}$ at the drain of the third PFET M97 is equal to $I_{out}$ times the size of the third PFET M97 divided by the size of the second PFET M92. $I_{dynamic}$ at the drain of the fourth PFET M98 is equal to $I_{out}$ times the size of the fourth PFET M98 divided by the size of the second PFET M92.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third PFET M97 to the size of the second PFET M92 and the ratio of the size of the fourth PFET M98 to the size of the second PFET M92, the slope of an $I_{dynamic}$ versus $V_{out}$ curve can be changed.

FIG. 9B is a schematic diagram of a transconductor 115 of FIG. 1 with a fixed offset current according to an embodiment of the present disclosure for converting the voltage $V_{out}$ to a current $I_{out}$ that is proportional to $V_{out}$.

Referring to FIG. 9B, the transconductor 115 is the same as the transconductor 115 of FIG. 9A, except for the addition of a fifth PFET M99 and a sixth PFET M100 for providing a fixed offset current to each output of the transconductor 115. The fifth PFET M99 has a source connected to the power supply voltage (e.g. $V_{DD}$), a gate for receiving an offset voltage ($V_{OS}$), which along with the size of the fifth PFET M99 sets the offset current, and a drain connected to the drain of the third PFET M97. The sixth PFET M100 has a source connected to the power supply voltage (e.g. $V_{DD}$), a gate for receiving the offset voltage ($V_{OS}$), which along with the size of the sixth PFET M100 sets the offset current, and a drain connected to the drain of the fourth PFET M100.

Figure 10:
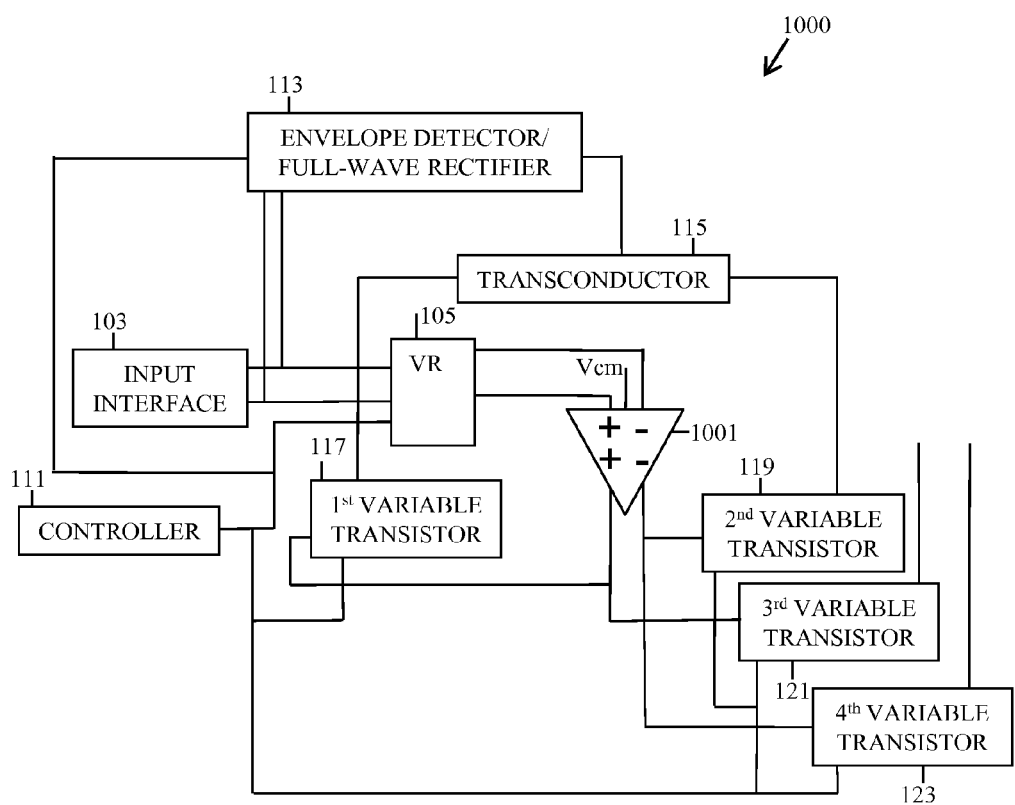
FIG. 10 is a schematic diagram of a dynamically biased baseband current amplifier according to an embodiment of the present disclosure.

FIG. 10 is a schematic diagram of a dynamically biased baseband current amplifier 1000 according to an embodiment of the present disclosure.

Referring to FIG. 10, the dynamically biased baseband current amplifier 1000 is identical to the dynamically biased baseband current amplifier 100 of FIG. 1, except that the first differential amplifier 107 and the second differential amplifier 109 of FIG. 1 are replaced by a fully differential amplifier 1001. Thus, a description of the components and the connections that are common between FIG. 1 and FIG. 10 is omitted here, and only the fully differential amplifier 1001 and the connections concerning the same are described below.

The fully differential amplifier 1001, has a positive input connected to the negative output of the variable resistor network 105, a negative input connected to the positive output of the variable resistor network 105, an input for receiving a common mode voltage ($V_{cm}$), and positive output, and a negative output.

The first variable transistor 117 has a control input for receiving a control signal from the controller 111, an input connected to the positive output of the fully differential amplifier 1001, and an input connected to the first output of the transconductor 115.

The second variable transistor 119 has a control input for receiving a control signal from the controller 111, an input connected to the negative output of the fully differential amplifier 1001, and an input connected to the second output of the transconductor 115.

The third variable transistor 121 has a control input for receiving a control signal from the controller 111, an input connected to the positive output of the fully differential amplifier 1001, and an output.

The fourth variable transistor 123 has a control input for receiving a control signal from the controller 111, an input connected to the negative output of the fully differential amplifier 1001, and an output.

Figure 11:
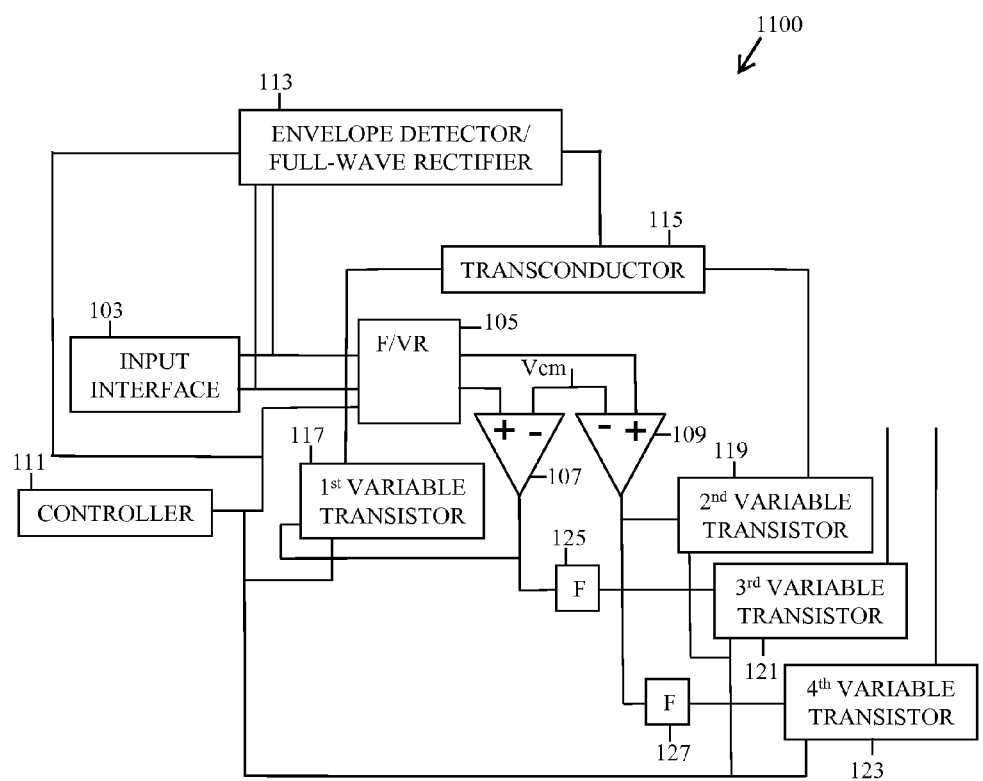
FIG. 11 is a schematic diagram of a dynamically biased baseband current amplifier according to an embodiment of the present disclosure that includes filters.

FIG. 11 is a schematic diagram of a dynamically biased baseband current amplifier 1100 according to an embodiment of the present disclosure.

Referring to FIG. 11, the dynamically biased baseband current amplifier 1100 is identical to the dynamically biased baseband current amplifier 100 of FIG. 1, except that a first filter 125 is connected between the first differential amplifier 107 and the third variable transistor 121 and a second filter 127 is connected between the second differential amplifier 109 and the fourth variable transistor 123. Thus, a description of the components and the connections that are common between FIG. 1 and FIG. 11 is omitted here, and only the first filter 125, the second filter 127, and the connections concerning the same are described below.

The first filter 125 has an input connected to the output of the first differential amplifier 107, and an output connected to the input of the third variable transistor 121.

The second filter 127 has an input connected to the output of the second differential amplifier 109, and an output connected to the input of the fourth variable transistor 123.

The first filter 125 and the second filter 127 may each be an RC filter as described above. However, the present disclosure is not limited to an RC filter. Any suitable filter may be used for the first filter 125 and the second filter 127.

Figure 12:
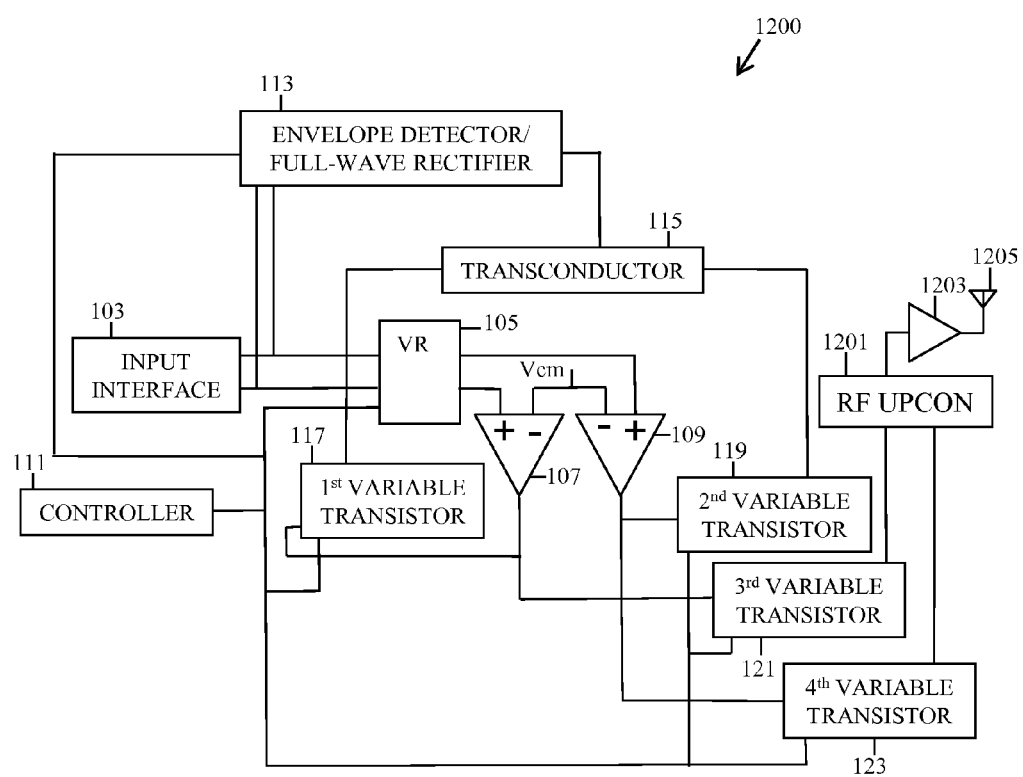
FIG. 12 is a schematic diagram of dynamically biased transmitter according to an embodiment of the present disclosure.

FIG. 12 is a schematic diagram of dynamically biased transmitter 1200 according to an embodiment of the present disclosure.

Referring to FIG. 12, the dynamically biased baseband transmitter 1200 includes a dynamically biased baseband current amplifier (e.g. the dynamically biased current amplifier 100 of FIG. 1), except for the addition of an RF upconverter 1201, an RF power amplifier 1203, and an antenna 1205. Thus, a description of the components and the connections that are common between FIG. 1 and FIG. 12 is omitted here, and only the RF upconverter 1201, the RF power amplifier 1203, the antenna 1205, and the connections concerning the same are described below.

The bias current of the RF upconverter 1201 is dynamically adjusted based on an instantaneous baseband signal swing using the hybrid differential envelope detector and full-wave rectifier 113.

The RF upconverter 1201 has a first input connected to the output of the third variable transistor 121, a second input connected to the output of the fourth variable transistor 123, and an output.

The RF power amplifier 1203 has an input connected to the output of the RF upconverter 1201 and an output.

The antenna 1205 has an input connected to the output of the RF power amplifier 1203.

Figure 13:
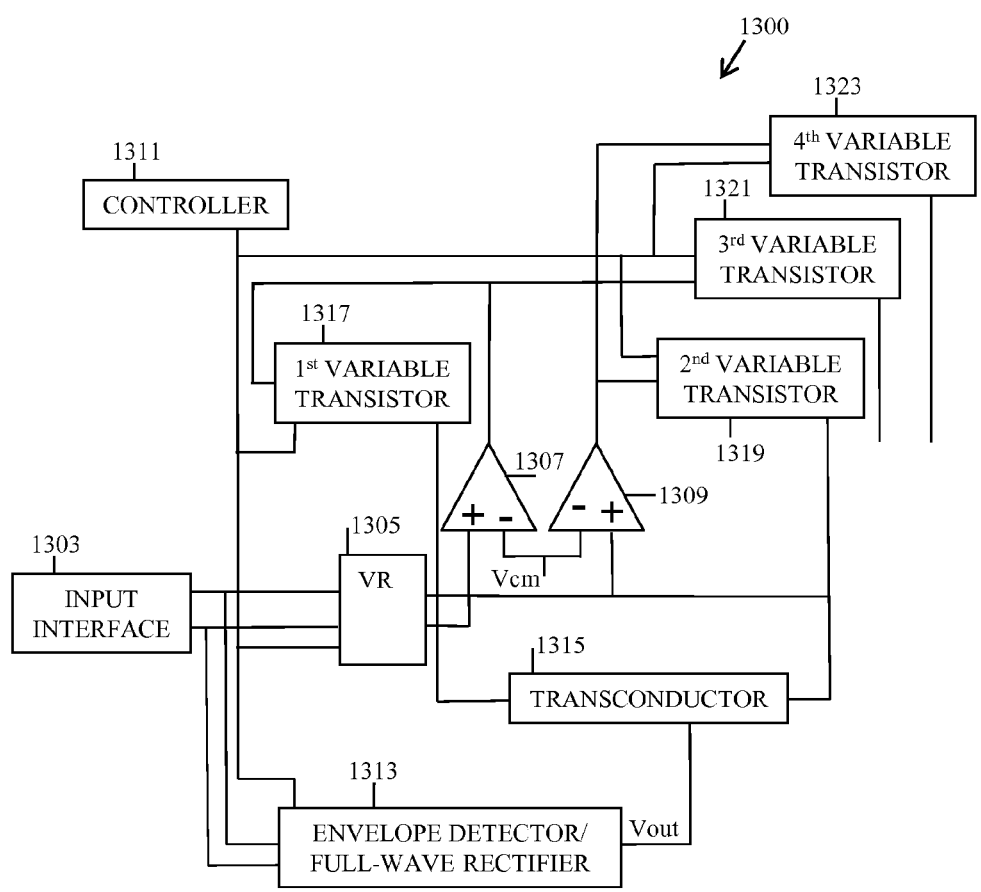
FIG. 13 is a schematic diagram of a dynamically biased baseband current amplifier according to an embodiment of the present disclosure.

FIG. 13 is a schematic diagram of a dynamically biased baseband current amplifier 1300 according to an embodiment of the present disclosure.

Referring to FIG. 13, the dynamically biased baseband current amplifier 1300 is identical to the dynamically biased baseband current amplifier 1300 of FIG. 1 except that the components replace NFETs with PFETs and vice versa.

In FIG. 13, the dynamically biased baseband current amplifier 1300 includes an input interface 1303, a variable resistor network 1305, a first differential amplifier 1307, a second differential amplifier 1309, a controller 1311, a hybrid differential envelope detector and full-wave rectifier 1313, a transconductor 1315, a first variable transistor 1317, a second variable transistor 1319, a third variable transistor 1321, and a fourth variable transistor 1323.

The input interface 1303 has a positive differential output and a negative differential output.

The variable resistor network 1305 has a positive input connected to the positive differential output of the input interface 1303, a negative input connected to the negative differential output of the input interface 1303, a positive output, and a negative output.

The first differential amplifier 1307 has a positive input connected to the negative output of the variable resistor network 1305, a negative input for receiving a common mode voltage ($V_{cm}$), and an output.

The second differential amplifier 1309 has a positive input connected to the positive output of the variable resistor network 1305, a negative input for receiving the common mode voltage ($V_{cm}$), and an output.

The controller 1311 is connected to the variable resistor network 1305, the hybrid differential envelope detector and full-wave rectifier 1313, the first variable transistor 1317, the second variable transistor 1319, the third variable transistor 1321, and the fourth variable transistor 1323. The controller 1311 controls the values of the components in the variable resistor network 1305, controls whether the hybrid differential envelope detector and full-wave rectifier 1313 is in envelope detection mode or full-wave rectification mode, controls the first variable transistor 1317 and the second variable transistor 1319 to establish an output current, and controls the third variable transistor 1321 and the fourth variable transistor 1323 to mirror the output current.

The hybrid differential envelope detector and full-wave rectifier 1313 has a first input for receiving a control input from the controller 1311, a second input connected to the positive output of the input interface 1303, a third input connected to the negative output of the input interface 1303, and an output connected to an input of the transconductor 1315. The hybrid differential envelope detector and full-wave rectifier 1313 produces a voltage $V_{out}$ at its output.

The transconductor 1315 has an input connected to the output of the hybrid differential envelope detector and full-wave rectifier 1313, a first output, and a second output. The transconductor 1315 converts the output voltage of the hybrid differential envelope detector and full-wave rectifier 1313 into a current.

The first variable transistor 1317 has a control input for receiving a control signal from the controller 1311, an input connected to the output of the first differential amplifier 1307, and an input connected to the first output of the transconductor 1315.

The second variable transistor 1319 has a control input for receiving a control signal from the controller 1311, an input connected to the output of the second differential amplifier 1309, and an input connected to the second output of the transconductor 1315.

The third variable transistor 1321 has a control input for receiving a control signal from the controller 1311, an input connected to the output of the first differential amplifier 1307, and an output.

The fourth variable transistor 1323 has a control input for receiving a control signal from the controller 1311, an input connected to the output of the second differential amplifier 1309, and an output.

Figure 14:
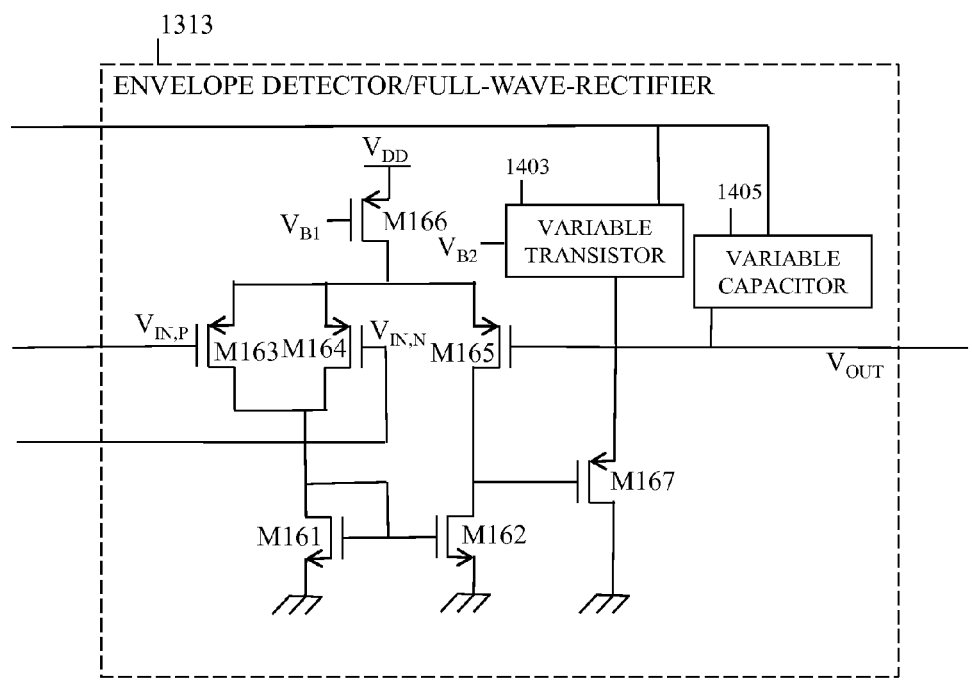
FIG. 14 is a schematic diagram of a hybrid differential envelope detector and full-wave rectifier of FIG. 13 according to an embodiment of the present disclosure.

FIG. 14 is a schematic diagram of a hybrid differential envelope detector and full-wave rectifier 1313 of FIG. 13 according to an embodiment of the present disclosure, where a different configuration than that of FIG. 7 is used (i.e., NFET pulldown transistors instead of PFET pullup transistors, PFET input transistors instead of NFET input transistors, and a PFET discharge transistor instead of a PFET charging transistor).

Referring to FIG. 14, the hybrid differential envelope detector and full-wave rectifier 1313 includes a first NFET M161, a second NFET M162, a first PFET M163, a second PFET M164, a third PFET M165, a fourth PFET M166, a fifth PFET M167, a variable transistor 1403, and a variable capacitor 1405.

The first NFET M161 has its source connected to a ground potential (e.g. $V_{SS}$), and its gate connected to its drain, the gate of the second NFET M162, the drain of the first PFET M163, and the drain of the second PFET M164.

The second NFET M162 has its source connected to the ground potential (e.g. $V_{SS}$), its gate connected to the gate of the first NFET M161, and its drain connected to the drain of the third PFET M165 and the gate of the fifth PFET M167.

The first PFET M163 has its drain connected to the drain of the first NFET M161 and its source connected to the source of the second PFET M164, the source of the third PFET M165, and the drain of the fourth PFET M166. The gate of the first PFET M163 is the positive terminal of the hybrid differential envelope detector and full-wave rectifier 1400 and receives a positive differential input voltage (e.g., $V_{in,p}$).

The second PFET M164 has its drain connected to the drain of the first NFET M161 and its source is connected to the source of the first PFET M163, the source of the third PFET M165, and the drain of the fourth PFET M166. The gate of the second PFET M164 is the negative terminal of the hybrid differential envelope detector and full-wave rectifier 1400 and receives a negative differential input voltage (e.g., $V_{in,n}$).

The third PFET M165 has its source connected to the source of the first PFET M163, the source of the second PFET M164, and the drain of the fourth PFET M166. The drain of the third PFET M165 is connected to the drain of the second NFET M162 and the gate of the fifth PFET M167. The gate of the third PFET M165 is connected to the source of the fifth PFET M167, a drain input of the variable transistor 1403, and a first terminal input of the variable capacitor 1405. The output voltage (e.g. $V_{out}$) of the hybrid differential envelope detector and full-wave rectifier 1313 appears at the gate of the third PFET M165.

The fourth PFET M166 has its source connected to a power supply voltage (e.g. $V_{DD}$) and its drain is connected to the source of the first PFET M163, the source of the second PFET M164, and the source of the third PFET M165. The gate of the fourth PFET M166 receives a first bias voltage (e.g., $V_{B1}$), which, in conjunction with the size of the fourth PFET M166, establishes a bias current $I_{bias}$ for the input stage of the hybrid differential envelope detector and full-wave rectifier 1313.

The fifth PFET M167 has its drain connected to the ground potential (e.g. $V_{SS}$). The gate of the fifth PFET M167 is connected to the drain of the second NFET M162 and the drain of the third PFET M165. The source of the fifth PFET M167 is connected to the gate of the third PFET M165, the drain output of the variable transistor 1403 and the first terminal input of the variable capacitor 1405. The output voltage (e.g. $V_{out}$) of the hybrid differential envelope detector and full-wave rectifier 1313 appears at the source of the fifth PFET M167.

A controller 1311 is connected to a control input bus of the variable transistor 1403 and a control input bus of the variable capacitor 1405. The controller 1311 controls the effective size (e.g. width) of the variable transistor 1403 and the effective capacitance of the variable capacitor 1405.

The variable transistor 1403 has a gate input for receiving a second bias voltage (e.g. $V_{B2}$), a control input bus connected to the controller 1311, and a drain output connected to the gate of the third PFET M165, the source of the fifth PFET M167, and the first terminal of the variable capacitor 1405. The output voltage (e.g. $V_{out}$) of the hybrid differential envelope detector and full-wave rectifier 1313 appears at the drain output of the variable transistor 1403.

The variable capacitor 1405 has a control input bus connected to the controller 1311 and a terminal connected to the gate of the third PFET M165, the source of the fifth PFET M167, and the drain output of the variable transistor 1403. The output voltage (e.g. $V_{out}$) of the hybrid differential envelope detector and full-wave rectifier 1313 appears at the first terminal of the variable capacitor 1405. Alternatively, the second terminal of the variable capacitor 1405 may be connected to a predetermined Direct Current (DC) voltage.

Figure 15:
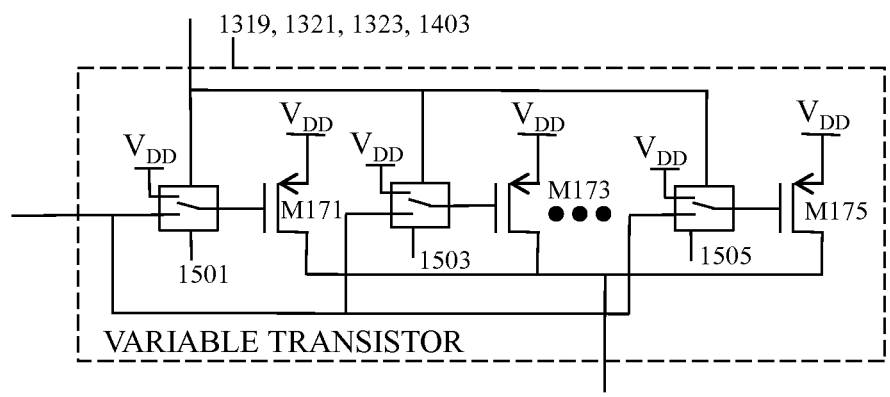
FIG. 15 is a schematic diagram of a variable transistor of FIG. 13 according to an embodiment of the present disclosure.

FIG. 15 is a schematic diagram of a variable transistor 1319, 1321, and 1323 of FIG. 13 and 1403 of FIG. 14 according to an embodiment of the present disclosure.

Referring to FIG. 15, the variable transistor 1319, 1321, 1323, and 1403 includes n PFETs M171, M173, ..., M175 and n switches 1501, 1503, ..., 1505.

A bias voltage (e.g. $V_{B2}$) is received and connected to a first input terminal of each of the n switches 1501, 1503, ..., 1505. A second input terminal of each of the n switches 1501, 1503, ..., 1505 is connected to a power supply voltage (e.g., $V_{DD}$). A gate of each of the n PFETs M171, M173, ..., M175 is connected to an output terminal of one of the n switches 1501, 1503, ..., 1505. A source of each of the n PFETs M171, M173, ..., M175 is connected to the power supply voltage (e.g. VDD). A drain of each of the n PFETs is connected together to form the drain output of the variable transistor 1319, 1321, 1323, and 1403.

A control input bus, having n inputs for receiving n control bits from the controller 1311, is connected to the n switches 1501, 1503, ..., 1505, so that each control input of each of the n switches 1501, 1503, ..., 1505 receives one of the n control bits from the controller 1311, which causes either the bias voltage (e.g. $V_{B2}$) or the power supply voltage (e.g. $V_{DD}$) to be applied to one of the gates of n PFETs M171, M173, ..., M175. Applying the bias voltage (e.g. $V_{B2}$) to a gate of one of the n PFETs M171, M173, ..., M175 turns on the corresponding PFET, and applying a power supply voltage (e.g. $V_{DD}$) to a gate of one of the n PFETs M171, M173, ..., M175 turns off the corresponding PFET.

The control bits received from the controller 1311 determine which of the n PFETs M171, M173, ..., M175 is turned on or turned off. The number of PFETs that are turned on and the sizes of the PFETS that are turned on determine $I_{discharge}$. The sizes of the n PFETs M171, M173, ..., M175 may be the same or they may be different from each other. If the sizes are different, the difference may be in a predetermined pattern (e.g., a ladder pattern for greater accuracy).

Figure 16:
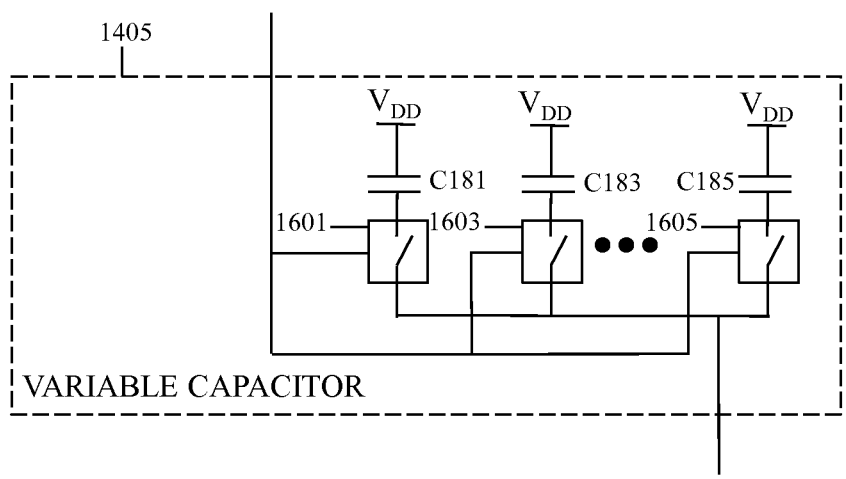
FIG. 16 is a schematic diagram of a variable capacitor of FIG. 13 according to an embodiment of the present disclosure.

FIG. 16 is a schematic diagram of a variable capacitor 1405 of FIG. 13 according to an embodiment of the present disclosure.

Referring to FIG. 16, the variable capacitor 1405 includes n capacitors C181, C183, ..., C185 and n switches 1601, 1603, ..., 1605.

A first terminal of each of the n capacitors C181, C183, ..., C185 is connected to an input terminal of each of the n switches 1601, 1603, ..., 1605. A second terminal of each of the n capacitors C181, C183, ..., C185 is connected to a power supply voltage (e.g., $V_{DD}$). A second terminal of each of the n switches 1601, 1603, ..., 1605 is connected together to form the terminal of the variable capacitor 1405. Alternatively, the second terminal of each of the n capacitors C181, C183, ..., C185 may be connected to a DC voltage other than the power supply voltage (e.g., $V_{DD}$).

A control input bus, having n inputs for receiving n control bits from the controller 1311, is connected to the n switches 1601, 1603, ..., 1605, so that each control input of each of the n switches 1601, 1603, ..., 1605 receives one of the n control bits from the controller 1311, which causes one of the n capacitors C181, C183, ..., C185 to be connected to, or disconnected from, the terminal of the variable capacitor 1405.

The control bits received from the controller 1311 determine which of the n capacitors C181, C183, ..., C185 is connected to the terminal of the variable capacitor 1405. The number of capacitors that are connected to the terminal of the variable capacitor 1405, the sizes of the capacitors, and $I_{discharge}$ determine how closely $V_{out}$ tracks and $V_{in,n}$. The sizes of the n capacitors C181, C183, ..., C185 may be the same or they may be different from each other. If the sizes are different, the difference may be in a predetermined pattern (e.g., a ladder pattern for greater accuracy).

Figure 17:
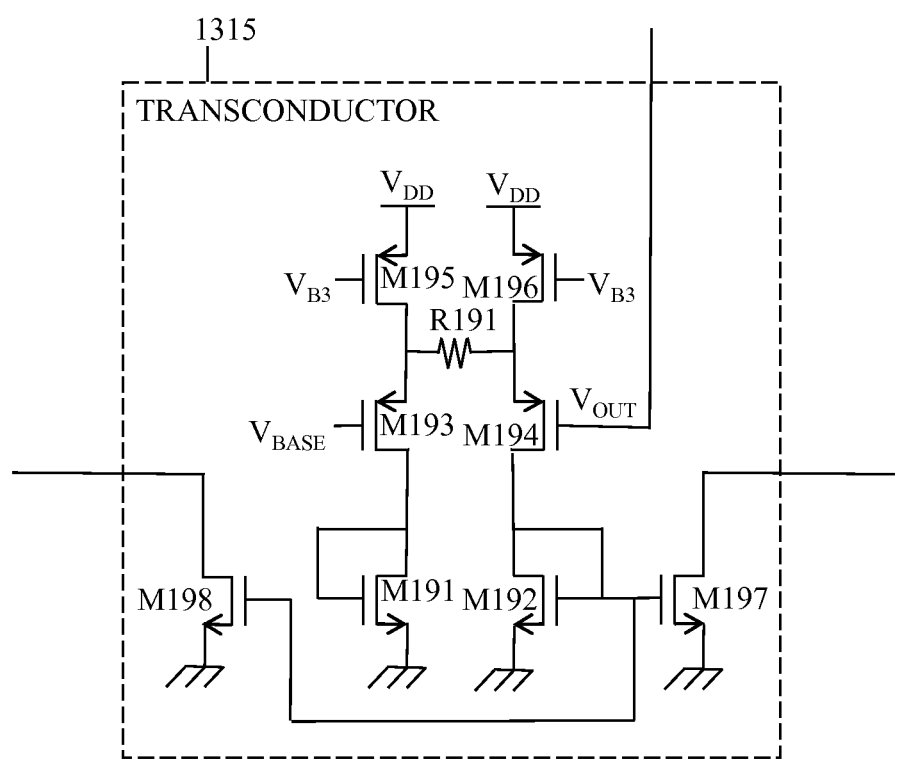
FIG. 17 is a schematic diagram of a transconductor of FIG. 13 according to an embodiment of the present disclosure.

FIG. 17 is a schematic diagram of a transconductor 1315 of FIG. 13 according to an embodiment of the present disclosure for converting the voltage $V_{out}$ to a current $I_{out}$ that is proportional to $V_{out}$.

Referring to FIG. 17, the transconductor 1315 includes a first NFET M191, a second NFET M192, a third NFET M197, a fourth NFET M198, a first PFET M193, a second PFET M194, a resistor R191, a third PFET M195, and a fourth PFET M196.

The first NFET M191 has a source connected to a ground potential (e.g. $V_{SS}$) and a gate connected to its drain and the drain of the first PFET M193, wherein the first NFET M191 is connected as a diode. The second NFET M192 has a source connected to the ground potential (e.g. $V_{SS}$) and a gate connected to its drain, the drain of the second PFET M194, the gate of the third NFET M197, and the gate of the fourth NFET M198, wherein the second NFET M192 is connected as a diode. The first PFET M193 has a drain connected to the drain and gate of the first NFET M191, a gate for receiving a reference voltage (e.g. $V_{BASE}$), and a source connected to a first end of a resistor R191 and the drain of the third PFET M195. The second PFET M194 has a drain connected to the gate of the third PFET M197 and the drain and gate of the second NFET M192. The second PFET M194 also has a gate for receiving $V_{out}$, and a source connected to a second end of the resistor R191 and the drain of the fourth PFET M196. The third PFET M195 has a drain connected to the source of the first PFET M193 and the first end of the resistor R191. The third PFET M195 also has a gate for receiving a bias voltage (e.g. $V_{B3}$) and a source connected to a power supply voltage (e.g. $V_{DD}$). The fourth PFET M196 has a drain connected to the source of the second PFET M194 and the second end of the resistor R191. The fourth PFET M196 also has a gate for receiving the bias voltage (e.g. $V_{B3}$) and a source connected to the power supply voltage (e.g. $V_{DD}$). The third NFET M197 has a source connected to the ground potential (e.g. $V_{SS}$) and a gate connected to the gate and drain of the second NFET M192, a gate of the fourth NFET M198, and the drain of the second PFET M194. $I_{out}$ appears at the drain of the second NFET M92 and is proportional to $V_{out}$. $I_{dynamic}$ appears at the drain of the third NFET M197 and is equal to $I_{out}$ times the ratio of the size of the third NFET M197 divided by the size of the second NFET M192. $I_{dynamic}$ also appears at the drain of the fourth NFET M198 and is equal to $I_{out}$ times the ratio of the size of the fourth NFET M198 divided by the size of the second NFET M192.

The $V_{BASE}$ voltage may be externally applied or internally generated using a Digital-to-Analog Converter (DAC). Changing $V_{BASE}$ changes the intercept of an $I_{out}$ versus $V_{out}$ curve. In addition, by changing the ratio of the size of the third NFET M197 to the size of the second NFET M192 and the ratio of the size of the fourth NFET M198 to the size of the second NFET M192, the slope of an $I_{dynamic}$ versus $V_{out}$ curve can be changed.

Although the embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A dynamically biased baseband current amplifier, comprising:
   an input interface, having a positive output and a negative output;
   a controller, having an output bus;
   a variable resistor network, having a first input connected to the positive output of the input interface, having a second input connected to the negative output of the input interface, a control input connected to the output bus of the controller, having a positive output, and having a negative output;
   an amplifier stage, having a first input for receiving a common mode voltage, having a second input connected to the positive output of the variable resistor network, having a third input connected to the negative output of the variable resistor network, having a first output, and having a second output;
   a hybrid differential envelope detector and full-wave rectifier, having a first input connected to the output bus of the controller, having a second input connected to the positive output of the input interface, having a third input connected to the negative output of the input interface, and having an output;
   a transconductor, having an input connected to the output of the hybrid differential envelope detector and full-wave rectifier, having a first output, and having a second output;
   a first variable transistor, having a first input connected to the output bus of the controller, having a second input connected to the first output of the amplifier stage, and having a third input connected to the first output of the transconductor;
   a second variable transistor, having a first input connected to the output bus of the controller, having a second input connected to the second output of the amplifier stage, and having a third input connected to the second output of the transconductor;
   a third variable transistor, having a first input connected to the output bus of the controller, having a second input connected to the first output of the amplifier stage, and having a third input; and
   a fourth variable transistor, having a first input connected to the output bus of the controller, having a second input connected to the second output of the amplifier stage, and having a third input.

2. The dynamically biased baseband current amplifier of claim 1, wherein the dynamically biased baseband current amplifier is implemented in a technology selected from Complementary Metal Oxide Semiconductor (CMOS), N-channel Metal Oxide Semiconductor (NMOS), P-channel Metal Oxide Semiconductor (PMOS), Gallium Arsenide (GaAs), Indium GaAs, Fin-shaped Field Effect Transistor (FinFET), and Bipolar.

3. The dynamically biased baseband current amplifier of claim 1, wherein the input interface is selected between a voltage input interface and a current input interface, wherein the current input interface comprises:
   a differential amplifier, having a negative input for receiving a common mode voltage, having a positive input, and having an output;
   a first N-channel Field Effect Transistor (NFET), having a gate connected to the output of the differential amplifier, having a source connected to a ground potential, and having a drain;
   a second NFET, having a gate connected to the output of the differential amplifier, having a source connected to a ground potential, and having a drain;
   a current-output driving circuit, having a first output connected to the drain of the first NFET, and having a second output connected to the drain of the second NFET; and
   a compensation/averaging circuit connected between the drain of the first NFET and the drain of the second NFET.

4. The dynamically biased baseband current amplifier of claim 1, wherein each of the first, second, third, and fourth variable transistor is comprised of:
   a plurality of switches, wherein each of the plurality of switches includes a first input connected to a ground potential, a second input connected to the first input of the variable transistor, a third input connected to the second input of the variable transistor, and an output; and
   a plurality of NFETs, wherein each NFET includes a source connected to the ground potential, a gate connected to the output of one of the plurality of switches, and a drain connected to the third input of the variable transistor.

5. The dynamically biased baseband current amplifier of claim 1, wherein the variable resistor network is selected from one of a first variable resistor network, a second variable resistor network, and a third variable resistor,
wherein the first variable resistor network includes a first variable resistor between the first input and the positive output and a second variable resistor between the second input and the negative output,
wherein the second variable resistor network includes two variable resistors in series between the first input and the positive output and a variable capacitor between a connection between the two resistors and the ground potential, and another two variable resistors in series between the second input and the negative output and another variable capacitor between a connection between the two another resistors and the ground potential, and
wherein the third variable resistor network includes a first variable resistor between the first input and the positive output, a first variable capacitor between the first input and the ground potential, a second variable resistor between the second input and the negative output, a second variable capacitor between the second input and the ground potential, and a third variable resistor between the first input and the second input.

6. The dynamically biased baseband current amplifier of claim 1, wherein the hybrid differential envelope detector and full-wave rectifier, comprises:
a first P-channel Field Effect Transistor (PFET), having a source connected to a power supply voltage, having a gate, and having a drain connected to the gate;
a second PFET, having a source connected to the power supply voltage, having a gate connected to the gate of the first PFET, and having a drain;
a first N-channel Field Effect Transistor (NFET), having a source, having a gate for receiving a first input voltage, and having a drain connected to the drain of the first PFET;
a second NFET, having a source connected to the source of the first NFET, having a gate for receiving a second input voltage, and having a drain connected to the drain of the first NFET;
a third NFET, having a source connected to the source of the first NFET, having a gate at which a voltage $V_{out}$ appears, and having a drain connected to the drain of the second PFET;
a fourth NFET, having a source connected to a ground potential, having a gate for receiving a first bias voltage, and having a drain connected to the source of the first NFET;
a fifth NFET, having a source connected to the gate of the third NFET, having a gate connected to the drain of the second PFET, and having a drain connected to the power supply voltage;
a variable transistor, having an input for receiving a second bias voltage, having an input bus connected to the output bus of the controller, and having a drain input connected to the gate of the third NFET; and
a variable capacitor, having an input bus connected to the output bus of the controller, and having an output terminal connected to the gate of the third NFET,
wherein the variable transistor comprises:
a first plurality of switches, wherein each of the first plurality of switches includes a first input connected to the ground potential, a second input for receiving the second bias voltage, a third input connected to the input bus, and an output; and
a first plurality of NFETs, wherein each NFET includes a source connected to the ground potential, a gate connected to the output of one of the first plurality of switches, and a drain connected to the drain input; and
wherein the variable capacitor comprises:
a second plurality of switches, wherein each of the second plurality of switches includes a first input connected to the input bus, a second input, and an output connected to the output terminal; and
a second plurality of capacitors, wherein each capacitor has a first terminal connected to the ground potential, and a second terminal connected to the second input of one of the second plurality of switches.

7. The dynamically biased baseband current amplifier of claim 1, wherein the transconductor comprises:
a first PFET, having a source connected to the power supply voltage, having a gate, and having a drain connected to the gate;
a second PFET, having a source connected to the power supply voltage, having a gate, and having a drain connected to the gate;
a third PFET, having a source connected to the power supply voltage, having a gate connected to the gate of the second PFET, and having a drain at which appears $I_{dynamic}$;
a first NFET, having a source, having a gate for receiving a reference voltage $V_{BASE}$, and having a drain connected to the drain of the first PFET;
a second NFET, having a source, having a gate for receiving $V_{out}$, and having a drain connected to the drain of the second PFET;
a resistor, having a first terminal connected to the source of the first NFET, and having a second terminal connected to the source of the second NFET;
a third NFET, having a source connected to the ground potential, having a gate for receiving a third bias voltage, and having a drain connected to the source of the first NFET; and
a fourth NFET, having a source connected to the ground potential, having a gate for receiving the third bias voltage, and having a drain connected to the source of the second NFET.

8. The dynamically biased baseband current amplifier of claim 1, wherein the amplifier stage is selected from a combination of a first differential amplifier and a second differential amplifier and a fully differential amplifier.

9. The dynamically biased baseband current amplifier of claim 1, further comprising a first filter between the first output of the amplifier stage and the second input of the third variable transistor and a second filter between the second output of the amplifier stage and the second input of the fourth variable transistor.

10. The dynamically biased baseband current amplifier of claim 1, further comprising:
a Radio Frequency (RF) upconverter, having a first output connected to the third input of the third variable transistor, having a second output connected to the third input of the fourth variable transistor, and having an output;
a power amplifier, having an input connected to the output of the RF upconverter, and having an output, and
an antenna, having an input connected to the output of the power amplifier.

11. A dynamically biased baseband current amplifier, comprising:
an input interface, having a positive output and a negative output;
a controller, having an output bus;

a variable resistor network, having a first input connected to the positive output of the input interface, having a second input connected to the negative output of the input interface, a control input connected to the output bus of the controller, having a positive output, and having a negative output;

an amplifier stage, having a first input for receiving a common mode voltage, having a second input connected to the positive output of the variable resistor network, having a third input connected to the negative output of the variable resistor network, having a first output, and having a second output;

a hybrid differential envelope detector and full-wave rectifier, having a first input connected to the output bus of the controller, having a second input connected to the positive output of the input interface, having a third input connected to the negative output of the input interface, and having an output;

a transconductor, having an input connected to the output of the hybrid differential envelope detector and full-wave rectifier, having a first input, and having a second input;

a first variable transistor, having a first input connected to the output bus of the controller, having a second input connected to the first output of the amplifier stage, and having an output connected to the first input of the transconductor;

a second variable transistor, having a first input connected to the output bus of the controller, having a second input connected to the second output of the amplifier stage, and having an output connected to the second input of the transconductor;

a third variable transistor, having a first input connected to the output bus of the controller, having a second input connected to the first output of the amplifier stage, and having an output; and a fourth variable transistor, having a first input connected to the output bus of the controller, having a second input connected to the second output of the amplifier stage, and having an output.

12. The dynamically biased baseband current amplifier of claim 11, wherein the dynamically biased baseband current amplifier is implemented in a technology selected from Complementary Metal Oxide Semiconductor (CMOS), N-channel Metal Oxide Semiconductor (NMOS), P-channel Metal Oxide Semiconductor (PMOS), Gallium Arsenide (GaAs), Indium GaAs, Fin-shaped Field Effect Transistor (FinFET), and Bipolar.

13. The dynamically biased baseband current amplifier of claim 11, wherein the input interface is selected between a voltage input interface and a current input interface, wherein the current input interface comprises:

a differential amplifier, having a negative input for receiving a common mode voltage, having a positive input, and having an output;

a first N-channel Field Effect Transistor (NFET), having a gate connected to the output of the differential amplifier, having a source connected to a ground potential, and having a drain;

a second NFET, having a gate connected to the output of the differential amplifier, having a source connected to a ground potential, and having a drain;

a current-output driving circuit, having a first output connected to the drain of the first NFET, and having a second output connected to the drain of the second NFET; and a compensation/averaging circuit connected between the drain of the first NFET and the drain of the second NFET.

14. The dynamically biased baseband current amplifier of claim 11, wherein each of the first, second, third, and fourth variable transistor is comprised of:

a plurality of switches, wherein each of the plurality of switches includes a first input connected to the power supply voltage, a second input connected to the first input of the variable transistor, a third input connected to the second input of the variable transistor, and an output; and a plurality of PFETs, wherein each PFET includes a source connected to the power supply voltage, a gate connected to the output of one of the plurality of switches, and a drain connected to the output of the variable transistor.

15. The dynamically biased baseband current amplifier of claim 11, wherein the variable resistor network is selected from one of a first variable resistor network, a second variable resistor network, and a third variable resistor, wherein the first variable resistor network includes a first variable resistor between the first input and the positive output and a second variable resistor between the second input and the negative output, wherein the second variable resistor network includes two variable resistors in series between the first input and the positive output and a variable capacitor between a connection between the two resistors and the ground potential, and another two variable resistors in series between the second input and the negative output and another variable capacitor between a connection between the two another resistors and the ground potential, and wherein the third variable resistor network includes a first variable resistor between the first input and the positive output, a first variable capacitor between the first input and the ground potential, a second variable resistor between the second input and the negative output, a second variable capacitor between the second input and the ground potential, and a third variable resistor between the first input and the second input.

16. The dynamically biased baseband current amplifier of claim 11, wherein the hybrid differential envelope detector and full-wave rectifier, comprises:

a first N-channel Field Effect Transistor (NFET), having a source connected to a ground potential, having a gate, and having a drain connected to the gate; a second NFET, having a source connected to the ground potential, having a gate connected to the gate of the first NFET, and having a drain;

a first P-channel Field Effect Transistor (PFET), having a source, having a gate for receiving a first input voltage, and having a drain connected to the drain of the first NFET; a second PFET, having a source connected to the source of the first PFET, having a gate for receiving a second input voltage, and having a drain connected to the drain of the first PFET;

a third PFET, having a source connected to the source of the first PFET, having a gate at which a voltage $V_{out}$ appears, and having a drain connected to the drain of the second NFET;

a fourth PFET, having a source connected to a power supply voltage, having a gate for receiving a first bias voltage, and having a drain connected to the source of the first PFET;

a fifth PFET, having a source connected to the gate of the third PFET, having a gate connected to the drain of the second NFET, and having a drain connected to the ground potential;

a variable transistor, having an input for receiving a second bias voltage, having an input bus connected to the output bus of the controller, and having a drain output connected to the gate of the third PFET; and a variable capacitor, having an input bus connected to the output bus of the controller, and having an output terminal connected to the gate of the third PFET, wherein the variable transistor comprises:

a first plurality of switches, wherein each of the first plurality of switches includes a first input connected to the power supply voltage, a second input for receiving the second bias voltage, a third input connected to the input bus, and an output; and a first plurality of PFETs, wherein each PFET includes a source connected to the power supply voltage, a gate connected to the output of one of the first plurality of switches, and a drain connected to the drain output; and wherein the variable capacitor comprises:

a second plurality of switches, wherein each of the second plurality of switches includes a first input connected to the input bus, a second input, and an output connected to the output terminal; and a second plurality of capacitors, wherein each capacitor has a first terminal connected to the power supply voltage, and a second terminal connected to the second input of one of the second plurality of switches.

17. The dynamically biased baseband current amplifier of claim 11, wherein the transconductor comprises:

a first NFET, having a source connected to the ground potential, having a gate, and having a drain connected to the gate;

a second NFET, having a source connected to the ground potential, having a gate, and having a drain connected to the gate;

a third NFET, having a source connected to the ground potential, having a gate connected to the gate of the second NFET, and having a drain at which appears $I_{dynamic}$;

a first PFET, having a source, having a gate for receiving a reference voltage $V_{BASE}$, and having a drain connected to the drain of the first NFET;

a second PFET, having a source, having a gate for receiving $V_{out}$, and having a drain connected to the drain of the second NFET;

a resistor, having a first terminal connected to the source of the first PFET, and having a second terminal connected to the source of the second PFET;

a third PFET, having a source connected to the power supply voltage, having a gate for receiving a third bias voltage, and having a drain connected to the source of the first PFET; and a fourth PFET, having a source connected to the power supply voltage, having a gate for receiving the third bias voltage, and having a drain connected to the source of the second PFET.

18. The dynamically biased baseband current amplifier of claim 11, wherein the amplifier stage is selected from a combination of a first differential amplifier and a second differential amplifier and a fully differential amplifier.

19. The dynamically biased baseband current amplifier of claim 11, further comprising a first filter between the first output of the amplifier stage and the second input of the third variable transistor and a second filter between the second output of the amplifier stage and the second input of the fourth variable transistor.

20. The dynamically biased baseband current amplifier of claim 11, further comprising:

a Radio Frequency (RF) upconverter, having a first input connected to the output of the third variable transistor, having a second input connected to the output of the fourth variable transistor, and having an output;

a power amplifier, having an input connected to the output of the RF upconverter, and having an output, and an antenna, having an input connected to the output of the power amplifier.

* * * * *